US010549985B2

(12) United States Patent
Maier et al.

(10) Patent No.: US 10,549,985 B2
(45) Date of Patent: Feb. 4, 2020

(54) SEMICONDUCTOR PACKAGE WITH A THROUGH PORT FOR SENSOR APPLICATIONS

(71) Applicant: Infineon Technologies AG, Neubiberg (DE)

(72) Inventors: Dominic Maier, Pleystein (DE); Matthias Steiert, Rosenheim (DE); Chau Fatt Chiang, Melaka (MY); Christian Geissler, Teugn (DE); Bernd Goller, Otterfing (DE); Thomas Kilger, Regenstauf (DE); Johannes Lodermeyer, Kinding (DE); Franz-Xaver Muehlbauer, Rimbach (DE); Chee Yang Ng, Johor (MY); Beng Keh See, Melaka (MY); Claus Waechter, Sinzing (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/692,938

(22) Filed: Aug. 31, 2017

(65) Prior Publication Data

US 2018/0148322 A1    May 31, 2018

Related U.S. Application Data

(60) Provisional application No. 62/426,412, filed on Nov. 25, 2016.

(51) Int. Cl.
*B81B 7/00* (2006.01)
*B81C 1/00* (2006.01)

(52) U.S. Cl.
CPC ........ *B81B 7/0058* (2013.01); *B81C 1/00301* (2013.01); *B81B 7/007* (2013.01); *B81B 7/0048* (2013.01); *B81B 7/0051* (2013.01);
*B81B 2201/02* (2013.01); *B81B 2203/0163* (2013.01); *B81B 2203/0315* (2013.01);
(Continued)

(58) Field of Classification Search
CPC ............ B81B 2201/02; B81B 2201/06; B81B 7/0058; B81B 2203/0353; B81B 2201/061; B81B 7/0048; B81B 7/0051; B81B 7/007; B81B 2207/091; B81B 2203/0315; B81B 2203/0163; B81C 1/00301
See application file for complete search history.

(56) References Cited

U.S. PATENT DOCUMENTS 5,335,210 A    8/1994   Bernstein
7,304,395 B2 *   12/2007   Tokumitsu .......... B81C 1/00301
                                                          257/784
(Continued)

OTHER PUBLICATIONS

Ma, Qing, et al., "Monolithic Integration of Multiple Sensors on a Single Silicon Chip", IEEE, Symposium on Design, Test, Integration & Packaging of MEMS and MOEMS, 2016, pp. 1-4.

*Primary Examiner* — Ida M Soward
(74) *Attorney, Agent, or Firm* — Murphy, Bilak & Homiller, PLLC

(57) ABSTRACT

A semiconductor package includes a semiconductor die having a sensor structure disposed at a first side of the semiconductor die, and a first port extending through the semiconductor die from the first side to a second side of the semiconductor die opposite the first side, so as to provide a link to the outside environment. Corresponding methods of manufacture are also provided.

15 Claims, 29 Drawing Sheets

(52) U.S. Cl.
CPC . *B81B 2203/0353* (2013.01); *B81B 2207/091* (2013.01); *B81B 2207/096* (2013.01); *B81C 2203/0118* (2013.01); *B81C 2203/0154* (2013.01)

(56) References Cited

U.S. PATENT DOCUMENTS

| | | | | |
|---|---|---|---|---|
| 7,600,533 | B2* | 10/2009 | Tai | F16K 99/0005 |
| | | | | 137/516.25 |
| 8,283,738 | B2* | 10/2012 | Fujii | B81B 7/007 |
| | | | | 257/414 |
| 9,334,156 | B2* | 5/2016 | Lin | B81B 7/007 |
| 9,772,245 | B2* | 9/2017 | Besling | G01L 9/0073 |
| 9,944,516 | B2* | 4/2018 | Chou | B81C 1/00619 |
| 10,131,538 | B2* | 11/2018 | Kaanta | B81B 7/0048 |
| 2005/0113004 | A1 | 5/2005 | Brandes | |
| 2008/0237823 | A1* | 10/2008 | Martin | B81B 7/0077 |
| | | | | 257/685 |
| 2010/0258882 | A1* | 10/2010 | Magnee | B81C 1/00246 |
| | | | | 257/415 |
| 2010/0285628 | A1* | 11/2010 | Martin | B81C 1/00182 |
| | | | | 438/53 |
| 2011/0165717 | A1* | 7/2011 | Lee | B81B 7/0061 |
| | | | | 438/50 |
| 2012/0043635 | A1* | 2/2012 | Yang | H01L 24/24 |
| | | | | 257/432 |
| 2013/0070951 | A1* | 3/2013 | Tanaka | H04R 1/38 |
| | | | | 381/361 |
| 2013/0115724 | A1* | 5/2013 | Kearl | B41J 2/1603 |
| | | | | 438/21 |
| 2013/0126991 | A1* | 5/2013 | Ehrenpfordt | H01L 29/66007 |
| | | | | 257/416 |
| 2013/0270660 | A1* | 10/2013 | Bryzek | H01L 29/84 |
| | | | | 257/418 |
| 2013/0285171 | A1* | 10/2013 | Najafi | B81B 7/0058 |
| | | | | 257/415 |
| 2013/0328139 | A1* | 12/2013 | Acar | G01C 19/5755 |
| | | | | 257/415 |
| 2015/0001645 | A1 | 1/2015 | Faralli et al. | |
| 2015/0001651 | A1 | 1/2015 | Faralli et al. | |
| 2015/0158716 | A1* | 6/2015 | Cheng | B81B 3/0005 |
| | | | | 257/254 |
| 2015/0175406 | A1* | 6/2015 | Lin | B81B 7/007 |
| | | | | 257/415 |
| 2015/0239732 | A1* | 8/2015 | Huang | B81C 1/00301 |
| | | | | 257/692 |
| 2015/0369681 | A1* | 12/2015 | Imai | G01C 5/06 |
| | | | | 73/727 |
| 2016/0146850 | A1* | 5/2016 | Reinmuth | G01P 15/125 |
| | | | | 73/514.32 |
| 2016/0159642 | A1* | 6/2016 | Hooper | B81B 7/0061 |
| | | | | 257/419 |
| 2016/0165330 | A1* | 6/2016 | Minervini | G01K 13/00 |
| | | | | 374/142 |
| 2016/0169758 | A1* | 6/2016 | Hooper | B81B 7/0061 |
| | | | | 73/717 |
| 2016/0229685 | A1 | 8/2016 | Boysel | |
| 2016/0282212 | A1* | 9/2016 | Beer | G01L 19/147 |
| 2017/0073218 | A1* | 3/2017 | Kaanta | B81B 7/0048 |
| 2017/0081175 | A1* | 3/2017 | Steiert | B81B 7/007 |
| 2017/0081179 | A1* | 3/2017 | Dawson | B81B 7/0061 |
| 2017/0156002 | A1* | 6/2017 | Han | H04R 1/14 |
| 2017/0313079 | A1* | 11/2017 | Chen | B41J 2/1637 |
| 2018/0290882 | A1* | 10/2018 | Rhee | B81C 1/00269 |
| 2018/0346320 | A1* | 12/2018 | Wang | B81B 7/0061 |
| 2019/0143325 | A1* | 5/2019 | Chen | B01L 3/502707 |

\* cited by examiner

| Figure 11 |
|---|
| Figure 11A |
| Figure 11B |
| Figure 11C |
| Figure 11D |
| Figure 11E |

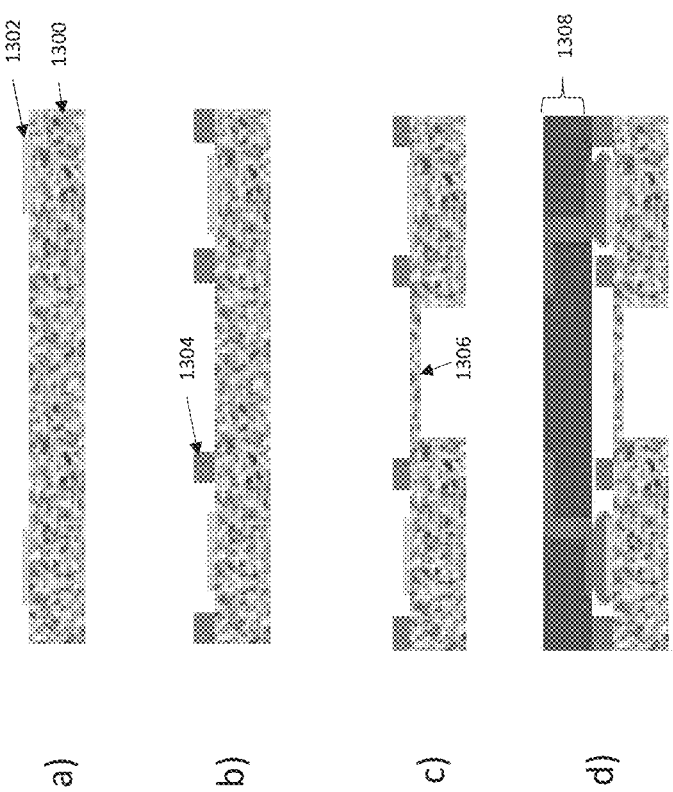

SEMICONDUCTOR PACKAGE WITH A THROUGH PORT FOR SENSOR APPLICATIONS

TECHNICAL FIELD

The present application relates to semiconductor packages, in particular to semiconductor packages with through ports and methods of manufacturing such packages.

BACKGROUND

For MEMS (microelectromechanical systems) and other sensor applications and packages, a dedicated link (port) is usually provided between the outside environment and the sensor structure. Most sensor structures are highly sensitive to particles and contamination. Hence, the port should provide protection against particles and contamination. Most common MEMS packages can be related to two basic types: open cavity packages OCP and molded cavity packages MCP.

In OCP packages, a cavity is formed mostly by a cap/lid which is fixed on a substrate. The cavity is typically formed by a pre-molded substrate or special lamination technique. Different cap/lid types and materials are available such as metal caps or molded lids. Also, several substrates are available such as PCBs (printed circuit boards), leadframes or pre-molded multi-layer substrates. The cap/lid is attached to the substrate typically by gluing or soldering. The cavity provides space for the sensor die and additional devices such as an ASIC (applicant-specific integrated circuit). For electrical connection, wire bonding as well as flip-chip technologies are typically used. If the inner volume (cavity) of the OCP package is to remain in contact with the outside environment, e.g. for sensor applications, a port is formed in the cap/lid or in the substrate for this purpose. Often such a port is implemented via a small vent hole in the cap/lid. The dies in the cavity are protected against mechanical loads, but not against particles, corrosive gases or fluids with such a configuration.

An MCP package is an over-molded package type. Leadframes or PCBs are commonly used as substrates. For electrical connection, wire bonding is commonly used. After die attachment and bonding, the package is overmolded. For this purpose, a special molding technology referred to as film assisted molding (FAM) is used. FAM allows for the formation of an opening in the mold compound. This opening then represents the port for sensor structures on the sensor die.

Both OCP and MCP package types fail to provide particle protection directly. Additional effort is needed to provide particle protection such as special meshes applied on the port which, increasing the overall package cost. Furthermore, both OCP and MCP package types are limited in minimum package footprint and height. This again increases overall package cost.

In the case of OCP packages, the footprint is limited due to three factors: the additional space consuming bonding area for the cap/lid; the wall thickness of the cap/lid; and the clearance needed between the dies and the cap/lid. This requires around about 700 µm of additional space in each dimension. In case of wire bonding, landing pads also increase the package dimensions. Moreover, the package price for OCP type packages is strongly driven by the cap/lid itself and by the cap/lid attachment which causes additional process steps such as glue dispensing and cap/lid placement. Such processes are mostly serial and time consuming.

The FAM process used for MCP type packages is a highly complex process and requires conformity with several often-conflicting specifications. Hence, the minimum port or opening size is limited due to many factors, including substrate tolerance, die attachment tolerance, mold tool tolerance and positioning tolerance of the substrate strip in the mold tool. Additional influencing factors such as mold pressure and mold tool force on the sensor structures must also be considered. As a result, the benefit in size reduction of MCP type packages compared to OCP type packages is minimal, and because of expensive mold tools and machine equipment, the resulting cost reduction is trivial.

The disadvantages listed above for standard OCP and MCP package types become much more crucial if monolithically integrated sensor-ASIC dies are used. In this case, the percentage between package size and die size decreases strongly.

As such, there is a need for a more cost effective sensor package with a port.

SUMMARY

According to embodiments described herein, a MEMS sensor package is provided which has a through silicon port (TSP) for providing a link to the outside environment. Protection against particles and contamination is mainly determined, and can be regulated, by the size or diameter of the TSP. The TSP can be implemented as a single hole from the backside of the semiconductor die/substrate, or as a plurality of smaller holes pre-etched from front side of the substrate followed by a deep etch from the substrate backside.

According to an embodiment of a semiconductor package, the semiconductor package comprises a semiconductor die having a sensor structure disposed at a first side of the semiconductor die, and a first port extending through the semiconductor die from the first side to a second side of the semiconductor die opposite the first side, so as to provide a link to the outside environment.

According to another embodiment of a semiconductor package, the semiconductor package comprises a semiconductor die having a sensor structure disposed at a first side of the semiconductor die, and a plurality of separate trenches extending through the semiconductor die from the first side to a second side of the semiconductor die opposite the first side. The plurality of separate trenches form spring structures around the sensor structure which decouple the sensor structure from mechanical stresses.

According to an embodiment of a method of manufacturing semiconductor packages, the method comprises: etching cavities in a first side of a first wafer; etching trenches in the first side of the first wafer, the cavities being separated from one another by the trenches; attaching the first wafer at the first side to a second wafer, the second wafer having a sensor structure facing and covered by the cavities etched in the first side of the first wafer; and thinning the first wafer at a second side opposite the first side, so that the trenches extend completely through the thinned first wafer.

According to another embodiment of a method of manufacturing semiconductor packages, the method comprises; attaching a plurality of semiconductor dies to a carrier, each semiconductor die having a sensor structure disposed at a first side of the semiconductor die, a first port extending through the semiconductor die from the first side to a second side opposite the first side, and a cap/lid attached to the first side and covering the sensor structure and the first port; forming electrically conductive vias on the first side of each semiconductor die outside the sensor structure and the cap/lid; over molding the carrier, the cap/lid and the semiconductor dies with a mold compound; thinning the mold compound at a side facing away from the carrier to expose the electrically conductive vias; forming a redistribution layer on the thinned side of the mold compound; removing the carrier; and forming individual semiconductor packages by cutting through the mold compound between adjacent ones of the semiconductor dies.

According to yet another embodiment of a method of manufacturing semiconductor packages, the method comprises: attaching a plurality of semiconductor dies to a carrier, each semiconductor die having a sensor structure disposed at a first side of the semiconductor die, a first port extending through the semiconductor die from the first side to a second side opposite the first side, and an interposer attached to the first side and covering the sensor structure and the first port; over molding the carrier, the interposer and the semiconductor dies with a mold compound; thinning the mold compound at a side facing away from the carrier to expose a side of the interposer facing away from the carrier; forming a redistribution layer on the thinned side of the mold compound; removing the carrier; and forming individual semiconductor packages by cutting through the mold compound between adjacent ones of the semiconductor dies.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

A through semiconductor port (TSP) is provided as part of a sensor package to provide a link to the outside environment. In one embodiment, a small hole is formed through the entire semiconductor substrate such as a semiconductor wafer or die. The hole can be formed using standard front-end processes such as deep-reactive-ion-etching (DRIE). Protection against particles and contamination is mainly determined, and can be regulated, by the size or diameter of the hole. Due to limited aspect ratios of etching the depth and diameter of the hole, a single hole may not always be the best case for particle protection. Methods of manufacturing such packages are also provided.

Figure 1:
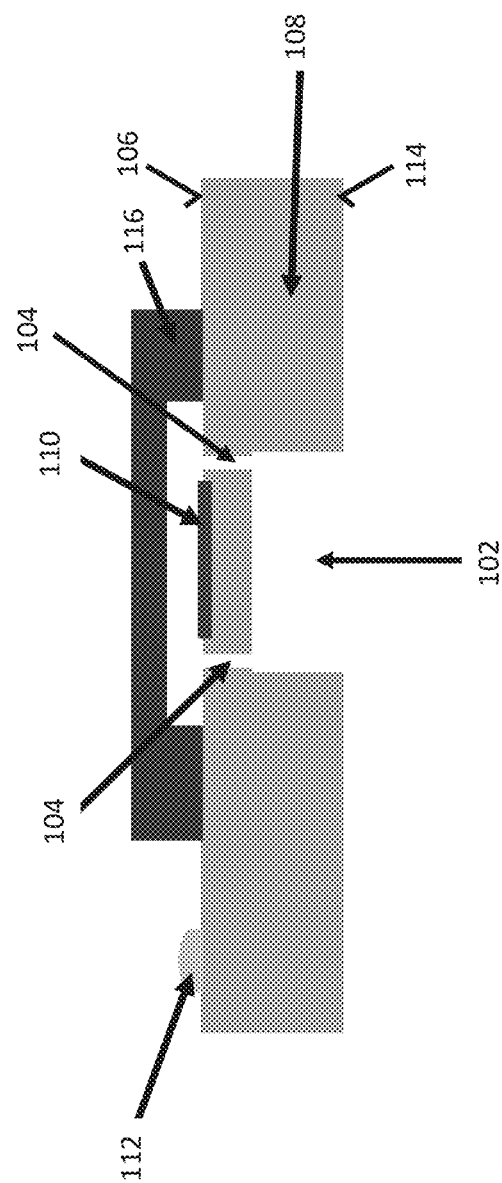
FIGS. 1 through 6 illustrate respective sectional views of different embodiments of a sensor package having a through semiconductor port.

FIG. 1 illustrates an embodiment of a sensor package 100 having a TSP 102 which provides improved particle and contamination protection. According to this embodiment, a plurality of small holes 104 is etched from the front-side 106 of a semiconductor die/substrate 108 to form a micro-port for particle filtration. Other structures also can be formed during the front-side etching process, such as grids, trenches or rings. For some applications, such as pressure sensors, trenches which are arranged in the structure in the form of springs can be used. Such spring structures provide a decoupling of mechanical stress to the sensor area 110 such as a MEMS sensor structure. The front-side 106 can also include bond pads 112 for providing external electrical contacts to the sensor package 100, A lid 114 such as a glass lid protects the sensor area 110.

After the front-side etching is done to form the micro-port particle filter, a deep etch from the back-side 114 of the semiconductor die substrate 108 is performed. The back-side etch is deep enough to reach the micro-port particle filtration structures 104 etched from the front-side 106, so as to complete the TSP 102 and form a link to the outside environment. With such a TSP 102 in combination with a lid 116 such as a glass lid or any other suitable closed wafer-level cap, the sensor area 110 is highly protected against particles and contamination. Additionally, the TSP solution provides access to several highly beneficial packaging technologies.

Figure 2:
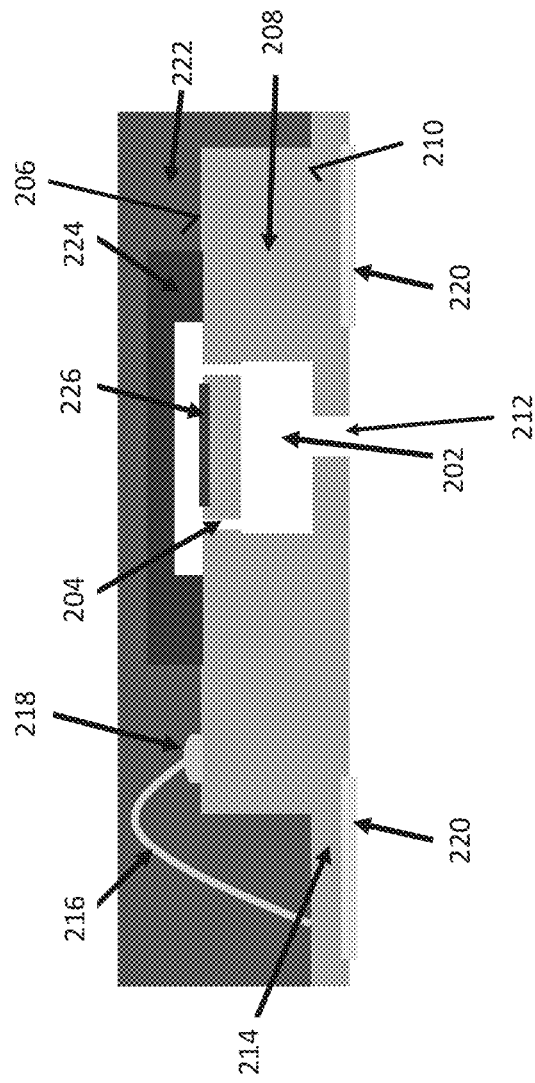

FIG. 2 illustrates an embodiment of a standard over molded LGA (land grid array) sensor package 200 having a TSP 202. The TSP 202 is formed by etching a plurality of small holes 204 in the front-side 206 of a semiconductor die/substrate 208 to form a micro-port particle filter, followed by a deep etch from the back-side 210 of the semiconductor die/substrate 208 to complete the TSP 202 and form a link to the outside environment as described above in connection with FIG. 1. According to the LGA embodiment, the TSP 202 allows use of standard molding processes. A hole 212 is formed in an underlying substrate 214 that supports the semiconductor die/substrate 208, such as a laminate substrate, to complete the link on the bottom of the package (bottom port). Electrical connections 216 such as bond wires are provided for electrically connecting bond pads 218 at the front-side 206 of the semiconductor die/substrate 208 to conductive pads or metal traces 220 of the underlying substrate 214 attached to the back-side of the semiconductor die/substrate 208. The semiconductor die/substrate 208 and the side of the underlying substrate 214 to which the semiconductor die/substrate 208 is attached can be covered by a mold compound 222. The opposite side of the underlying substrate 214 is free of molding compound, so that external electrical connections can be made to the sensor package 200 via the conductive pads or metal traces 220 of the underlying substrate 214. A lid 224 such as a glass lid or any other suitable closed wafer-level cap protects the sensor area 226 of the semiconductor die/substrate 208, and prevents mold compound from entering the cavity around the sensor area 226.

Figure 3:
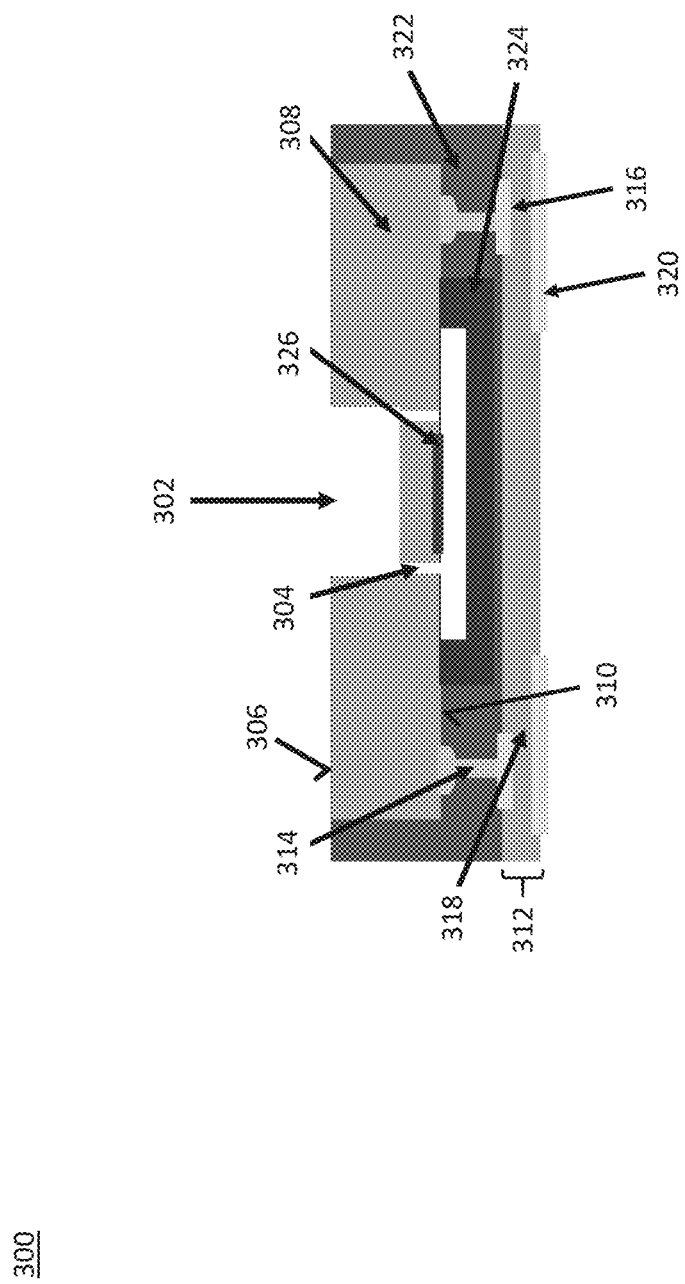

FIG. 3 illustrates an embodiment of a flip-chip package 300 having a TSP 302. The TSP 302 is formed by etching a plurality of small holes 304 from the front-side 306 of a semiconductor die/substrate 308 to form a micro-port particle filter, followed by a deep etch from the back-side 310 of the semiconductor die/substrate 308 to complete the TSP 302 and form a link to the outside environment as described above in connection with FIG. 1. According to the flip-chip embodiment, a redistribution layer (RDL) 312 is provided for redistributing the signal path to/from the semiconductor die/substrate 308. Several assembly techniques can be used to realize the connection between the semiconductor die/substrate 308 and the underling RDL-based substrate 312, such as Cu-bumps, stud bumps, bump-on-bump or wire-on-bump.

FIG. 3 shows a wire-on-bump connection 314 from the back-side 310 of the semiconductor die/substrate 308 to conductive pads or metal traces 316 at the side of the underlying RDL-based substrate 312 facing the semiconductor die/substrate 308. Via connections (out of view) extend through an insulative body 318 of the underlying RDL-based substrate 312 to conductive pads or metal traces 320 at the opposite side of the RDL-based substrate 312, providing external electrical connections to the sensor package 300.

The semiconductor die/substrate 308 can be covered by a mold compound 322, and the RDL-based substrate 312 attached to the mold compound 322. A lid 324 such as a glass lid or any other suitable closed wafer-level cap protects the sensor area 326 of the semiconductor die/substrate 308, and prevents mold compound from entering the cavity around the sensor area 326.

Figure 4:
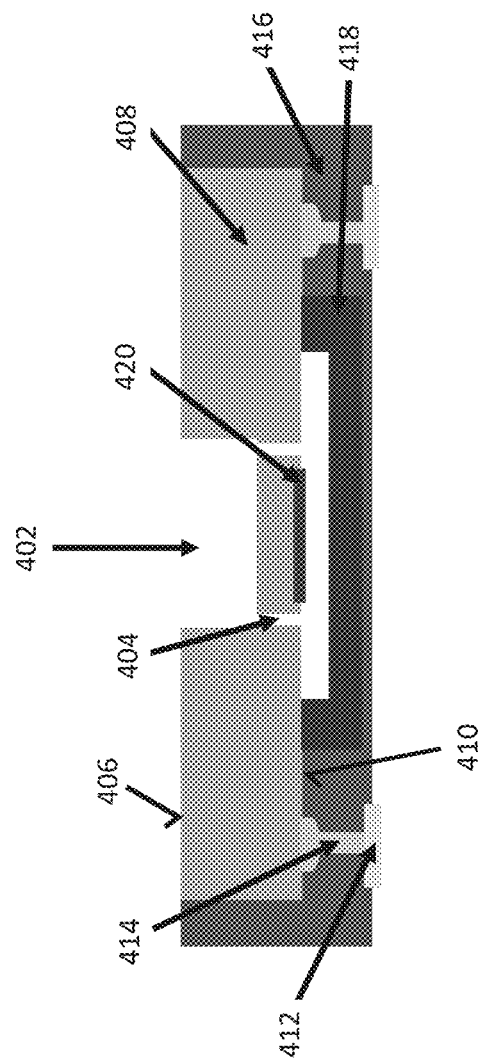

FIG. 4 illustrates an embodiment of an eWLB (embedded Wafer Level BGA) package 400 having a TSP 402. The TSP 402 is formed by etching a plurality of small holes 404 from the front-side 406 of a semiconductor die/substrate 408 to form a micro-port particle filter, followed by a deep etch from the back-side 410 of the semiconductor die/substrate 408 to complete the TSP 402 and form a link to the outside environment as described above in connection with FIG. 1.

By using eWLB technology, the sensor package 400 is further simplified. For example, each redistribution layer (RDL) can be formed using standard eWLB techniques. The connection between the semiconductor die/substrate 408 and conductive pads or metal traces 412 the RDL-based substrate (not shown) can be realized by wire-on-bump or bump-on-bump connections 414. The semiconductor die/substrate 408 can be covered by a mold compound 416. A lid 418 such as a glass lid or any other suitable closed wafer-level cap protects the sensor area 420 of the semiconductor die/substrate 408, and prevents mold compound from entering the cavity around the sensor area 420.

Figure 5:
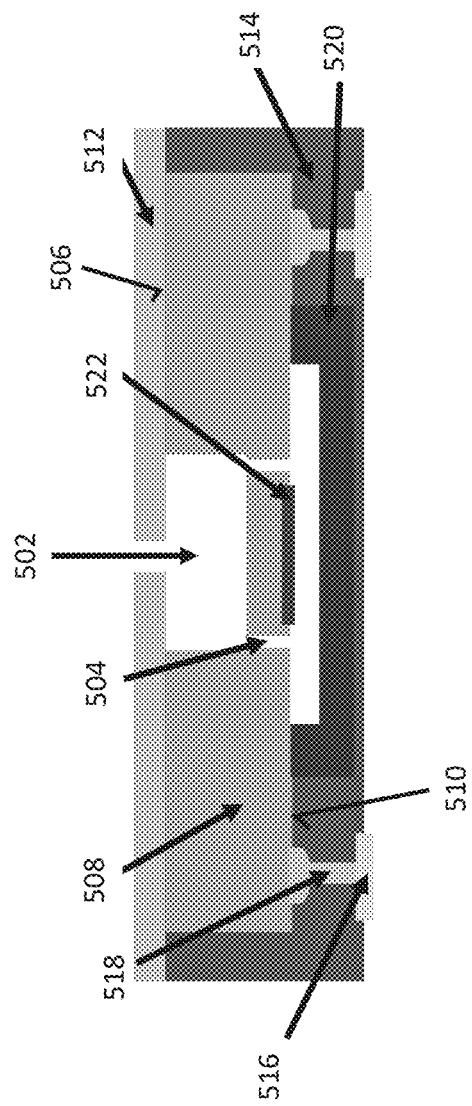

FIG. 5 illustrates an embodiment of a leadframe-based package 500 having a TSP 502. The TSP 502 is formed by etching a plurality of small holes 504 from the front-side 506 of a semiconductor die/substrate 508 to form a micro-port particle filter, followed by a deep etch from the back-side 510 of the semiconductor die/substrate 508 to complete the TSP 502 and form a link to the outside environment as described above in connection with FIG. 1.

To enable use of standard molding processes, the semiconductor die/substrate 508 can be directly attached to the leadframe 512. With such a configuration, the semiconductor die/substrate 508 can be over molded with a mold compound 514 without any additional effort. For each RDL, several plating technologies can be used. Also, the mold compound 514 can be laser activated. In this case, the activated areas can be electro-plated 516 such that the non-activated areas are not plated. The connection between the semiconductor die/substrate 508 and the RDL can be realized by wire-on-bump technology 518. A lid 520 such as a glass lid or any other suitable closed wafer-level cap protects the sensor area 522 of the semiconductor die/substrate 508, and prevents mold compound from entering the cavity around the sensor area 522.

Figure 6:
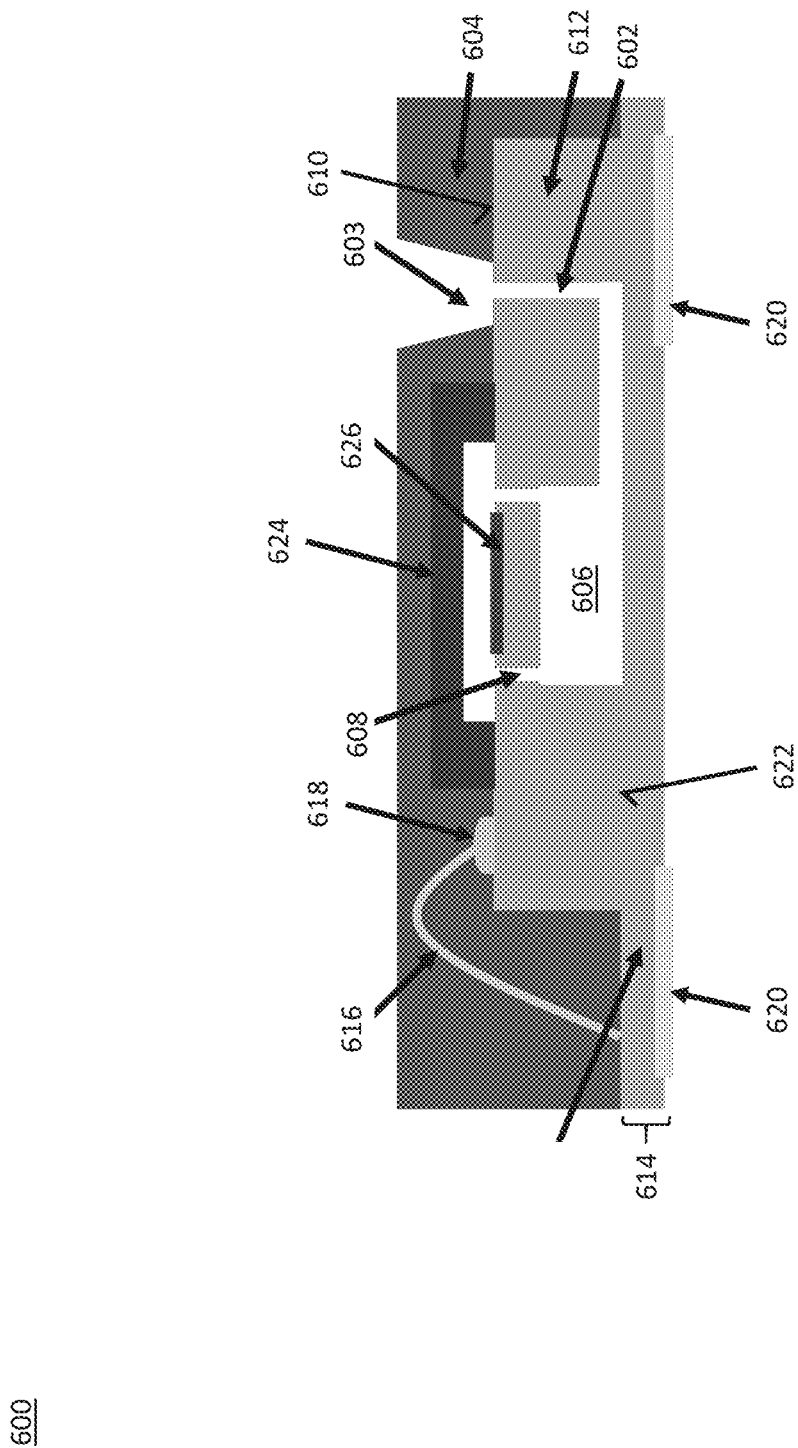

FIG. 6 illustrates an embodiment in which TSPs are used with film assisted molding (FAM). According to this embodiment, a first TSP 602 provides a link to the outside environment through an opening 603 in the mold compound 604 formed as part of the FAM process. A second TSP 606, which includes a micro-port particle filter 608 formed at the front-side 610 of a semiconductor die/substrate 612 as previously described herein, is in open communication with the first TSP 602. No opening is needed in the underlying substrate 614 according to this embodiment. Electrical connections 616 such as bond wires are provided for electrically connecting bond pads 618 at the front-side 610 of the semiconductor die/substrate 612 to conductive pads or metal traces 620 of the underlying substrate 614 attached to the back-side 622 of the semiconductor die/substrate 612. External electrical connections can be made to the sensor package 600 via the conductive pads or metal traces 620 of the underlying substrate 614. A lid 624 such as a glass lid or any other suitable closed wafer-level cap protects the sensor area 626 of the semiconductor die/substrate 612, and prevents mold compound from entering the cavity around the sensor area 626.

Figure 7:
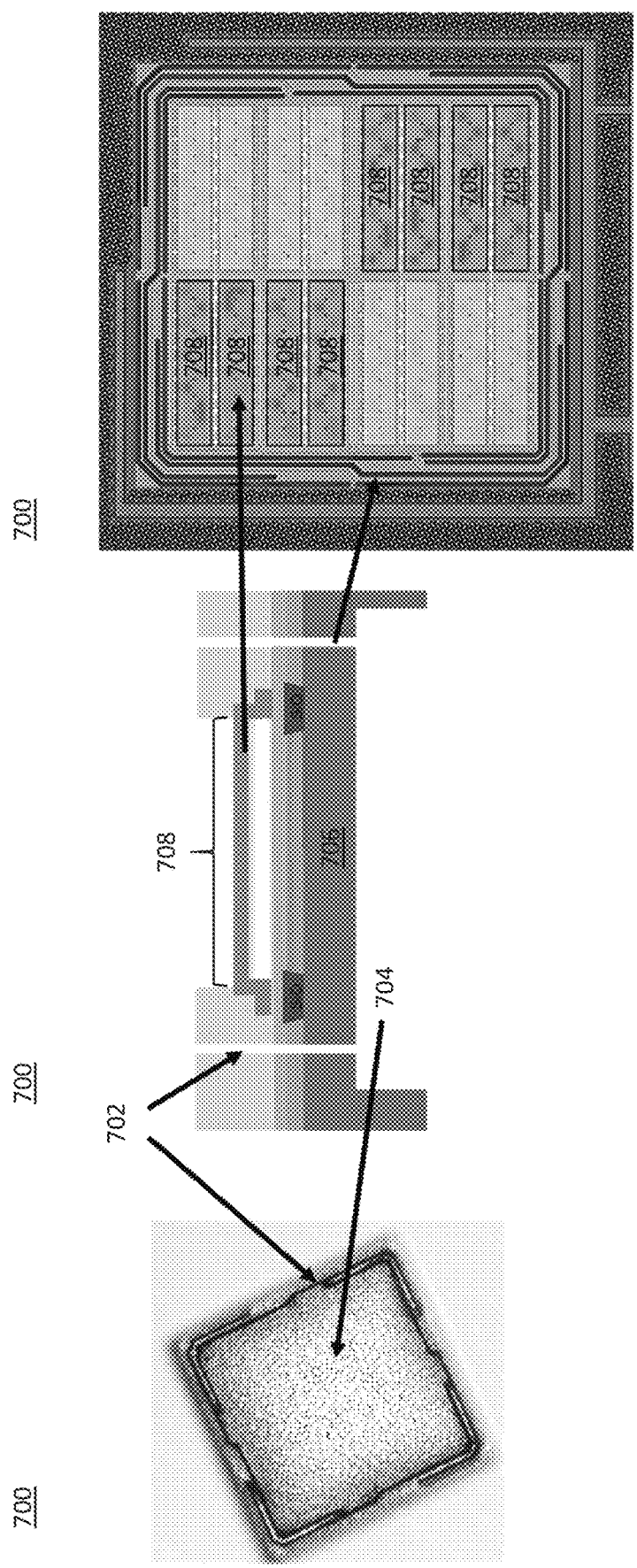
FIG. 7 illustrates top plan, sectional and bottom plan views of an embodiment of a sensor package having a through semiconductor port.

FIG. 7 illustrates an embodiment of a sensor package 700 in which a TSP is realized as an arrangement of different trenches 702 which also form spring structures around a kind of table/cavity region 704 of a semiconductor die/substrate 706. Sensor structures 708 such as MEMS sensor structures formed on the table region 704 are decoupled from mechanical stresses by the spring structures 702.

Figure 8:
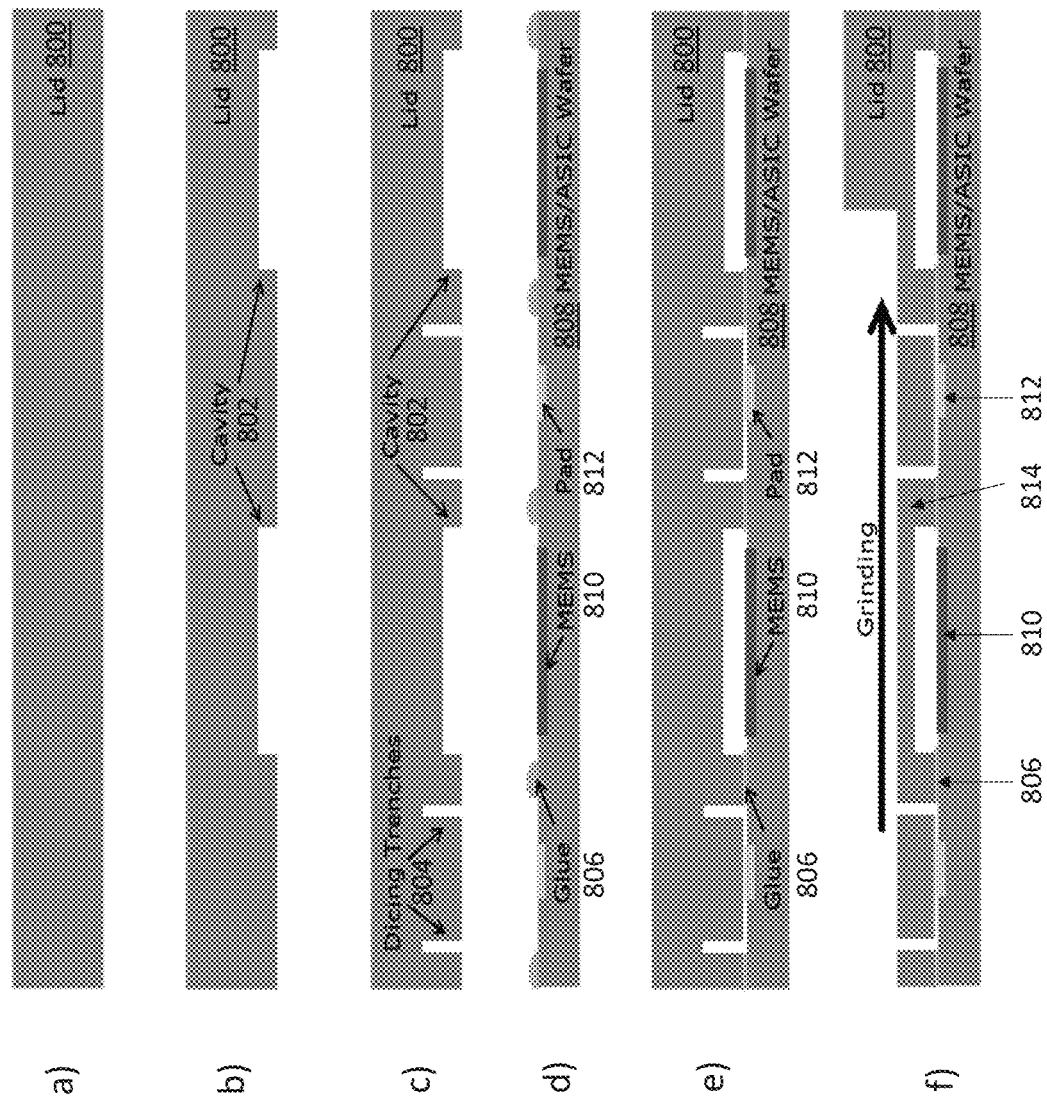
FIG. 8 illustrates an embodiment of a wafer-level method of manufacturing stress decoupling structures shown in FIG. 7.

FIG. 8 illustrates an embodiment of a wafer-level method of manufacturing the stress decoupling structures shown in FIG. 7. In general, there are different common processes available. The type and manufacturing technology of the cap/lid 800 is not significant. Different polymer caps/lids can be used, but also different process technologies such as dry resist or SU8 based methods. For example, SU-8 is a commonly used epoxy-based negative photoresist that can be used. In step a), a wafer 800 such as a Si wafer or eWLB is provided. The wafer 800 is used to form lids for the subsequently manufactured pressure sensor packages. In step b), cavities 802 are formed in the wafer 800. In the case of a Si wafer, standard etch chemistry can be used to form the cavities 802. In the case of an eWLB wafer, the cavities 802 can be formed by molding. In step c), trenches 804 are formed in the wafer between the cavities 802 e.g. using a standard dicing saw. In step d), an adhesive 806 such as glue is applied to a semiconductor wafer 808 e.g. by dispensing or screen printing. The semiconductor wafer 808 includes sensor structures 810 such as MEMS sensor structures, bond pads 812, and optional sensor logic circuitry such as ASIC circuitry. In step e), the lid wafer 800 is bonded to the sensor wafer 808 via the adhesive 806. In step f), the lid wafer 800 is thinned e.g. by grinding or CMP (chemical-mechanical polishing) to release individual lids 814 and open the bond pads 812.

FIGS. 9A through 9I illustrate an embodiment of a method of manufacturing an eWLB version of a sensor packaging having a TSP. For eWLB technology, several processes are available which can be used to build such a device. Accordingly, the final process flow can be different from the process flow shown in FIGS. 9A through 9I without departing from the main genesis of the inventive TSP concept.

Figure 9A:
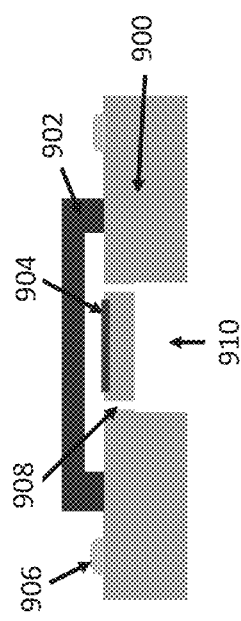
FIGS. 9A through 9I illustrate an embodiment of a method of manufacturing an eWLB (embedded Wafer Level BGA) version of a sensor packaging having a through semiconductor port.

FIG. 9A shows an individual one of a plurality of bare sensor dies 900 prior to eWLB carrier mounting. Each sensor die 900 has a wafer-level cap/lid 902 that protects the sensor area 904 of the die, and bond pads 906 for making electrical connections to the die 900. The TSP is formed by a plurality of small holes 908 etched into one front-side of the sensor die 900 to form a micro-port particle filter, and deep trenches 910 etched at the opposite side of the die 900.

Figure 9B:
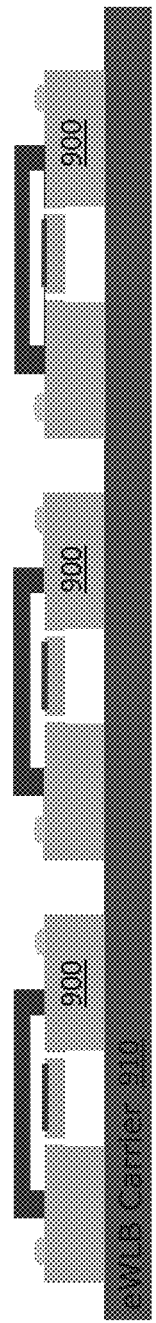

FIG. 9B shows the plurality of bare sensor dies 900 attached to an eWLB carrier 910.

Figure 9C:
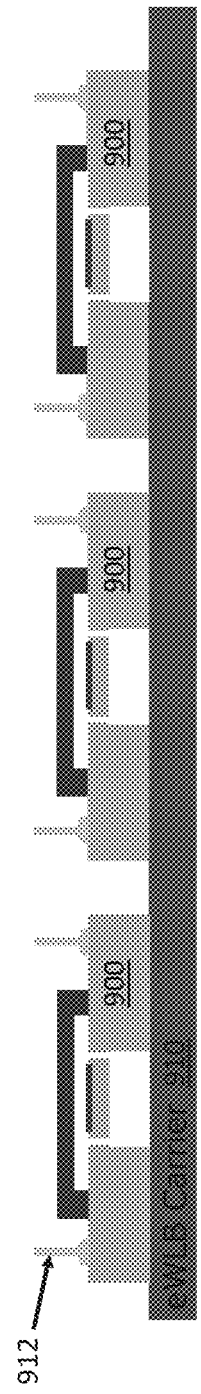

FIG. 9C shows wire-on-bump, ball-on-bump or wire loop connections to the bond pads of the plurality of bare sensor dies 900 attached to an eWLB carrier 910.

Figure 9D:
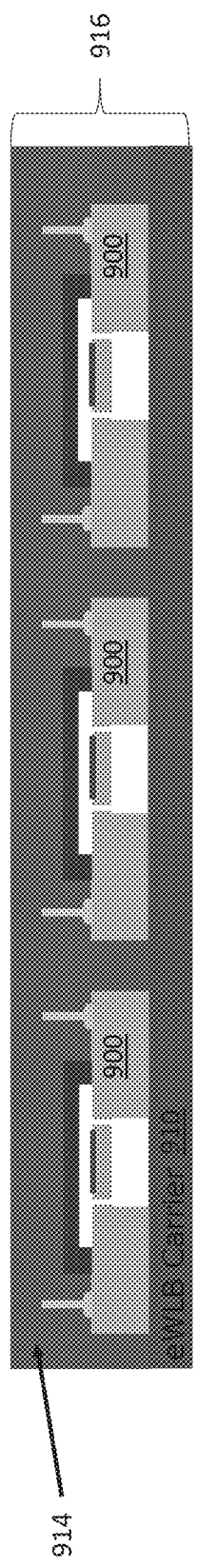

FIG. 9D shows the eWLB carrier 910 and plurality of bare sensor dies 900 over-molded with a mold compound 914 to form an eWLB wafer 916.

Figure 9E:
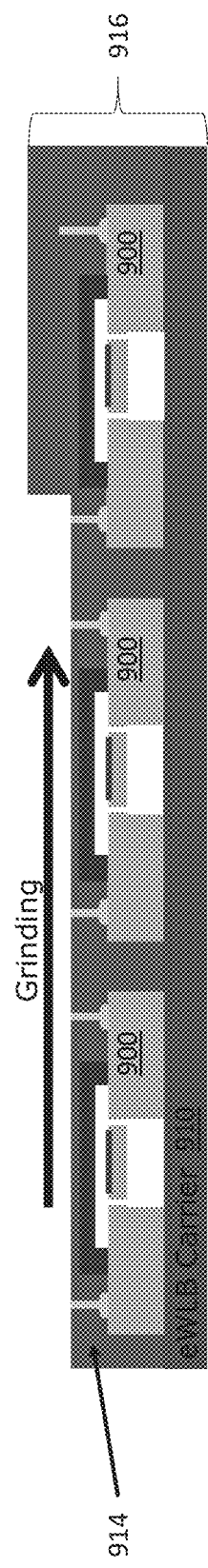

FIG. 9E shows the eWLB wafer 916 during grinding e.g. by CMP until the wire-on-bump, ball-on-bump or wire loop connections 914 are exposed. By grinding/CMP the mold compound 914, all height tolerances are brought to the same (single) planarized level. Only the tolerance of the grinding machine controls. The grinding process can be stopped by infrared line and measurement of a special die implemented in the eWLB wafer 916, where the thickness of the die is measured during the grinding process. In another embodiment, eWLB wafers are grouped by thickness and each group is ground in a different way.

Figure 9F:
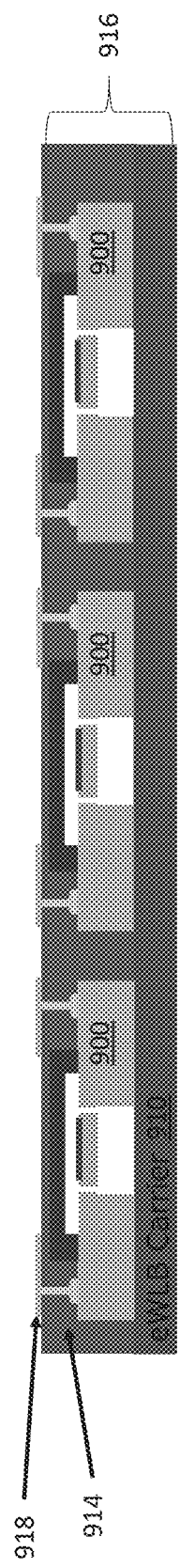

FIG. 9F shows RDL layers 918 including solder pads formed on the thinned side of the eWLB wafer 916.

Figure 9G:
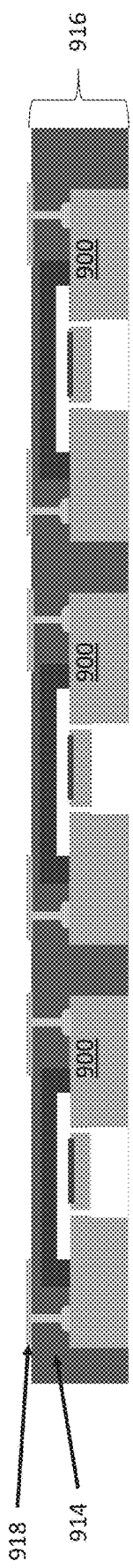

FIG. 9G shows the eWLB wafer 916 after removal of the eWLB carrier 910.

Figure 9H:
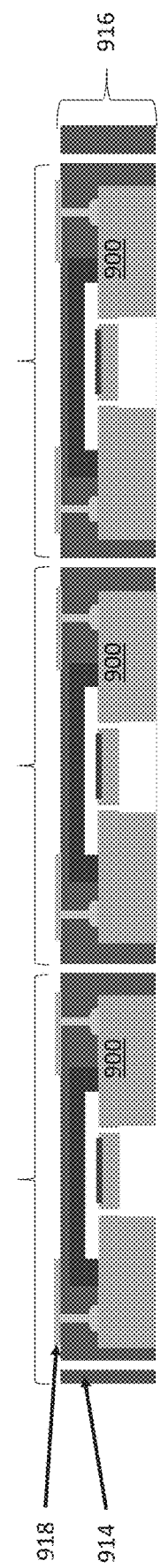

FIG. 9H shows the eWLB wafer 916 after singulation into single sensor package units 920.

Figure 9I:
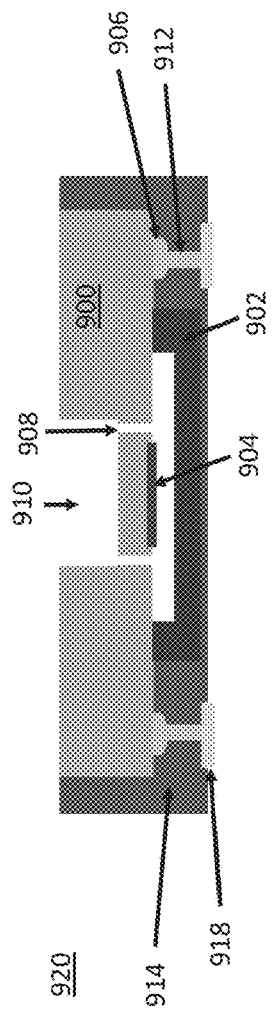

FIG. 9I shows an individual one of the sensor package units 920 after singulation.

Figure 10:
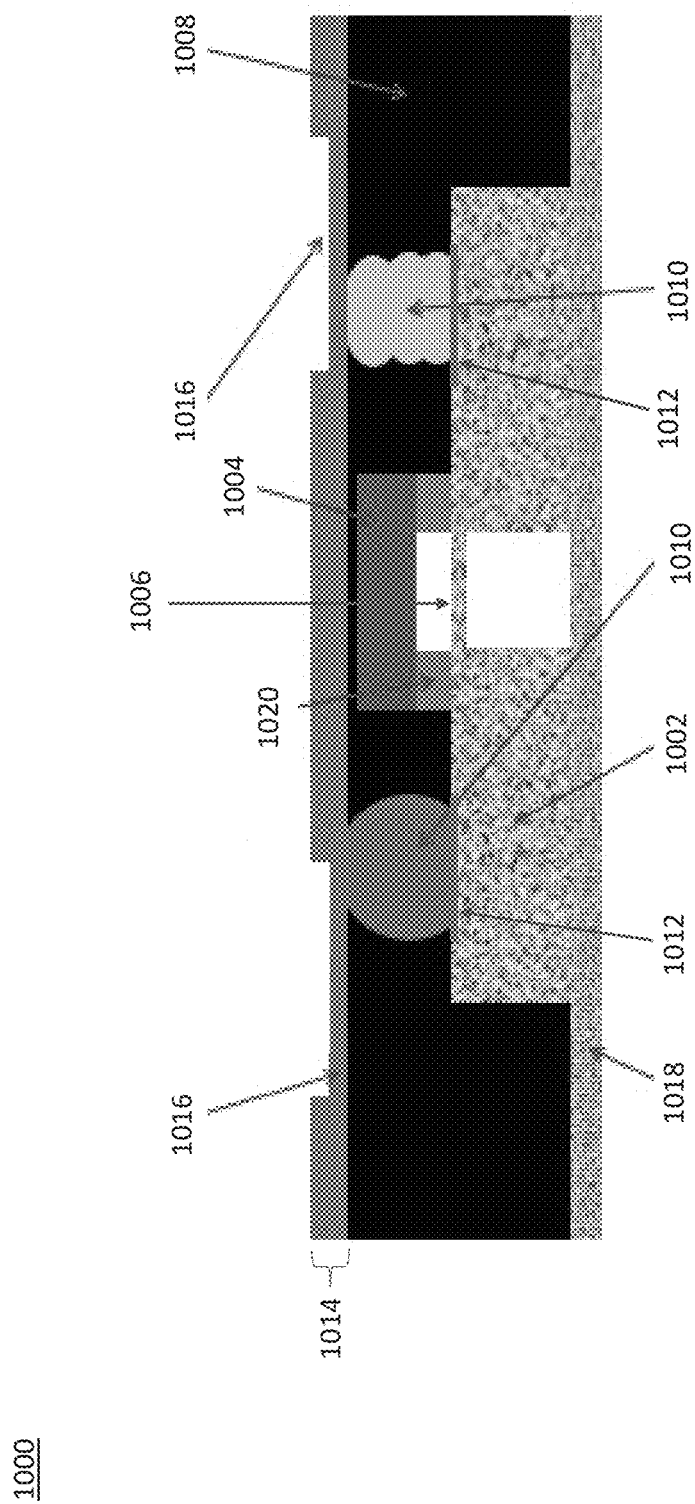
FIG. 10 illustrates a sectional view of an embodiment of a sensor package having a through semiconductor port.

FIG. 10 illustrates another embodiment of a sensor package 1000 having a semiconductor substrate/die 1002 such as a Si die with a protection lid 1004 over a sensing area 1006 such as a MEMS sensor structure and embedded in a mold compound 1008 having through-mold interconnects 1010 which connect bond pads 1012 of the substrate/die 1002 to a redistribution layer 1014. The through-mold interconnects 1010 can be realized by a plating or a stud-bumping process. The RDL 1014 has metal traces 1016 that route to solder pads (not shown) in the fan-out area. Solder pad finish (not shown) can be done by solder paste printing, solder ball apply, electroless pad plating (e.g. NiPPdAu), galvanic plated solder cap, etc. A protection mesh 1018 can be provided at the opposite side of the package 1000 as the RDL layer 1014. An optional standoff frame 1020 can be provided to seal the cavity between the lid 1004 and the substrate/die 1002. The TSP is out-of-view in FIG. 10.

Figure 11A:
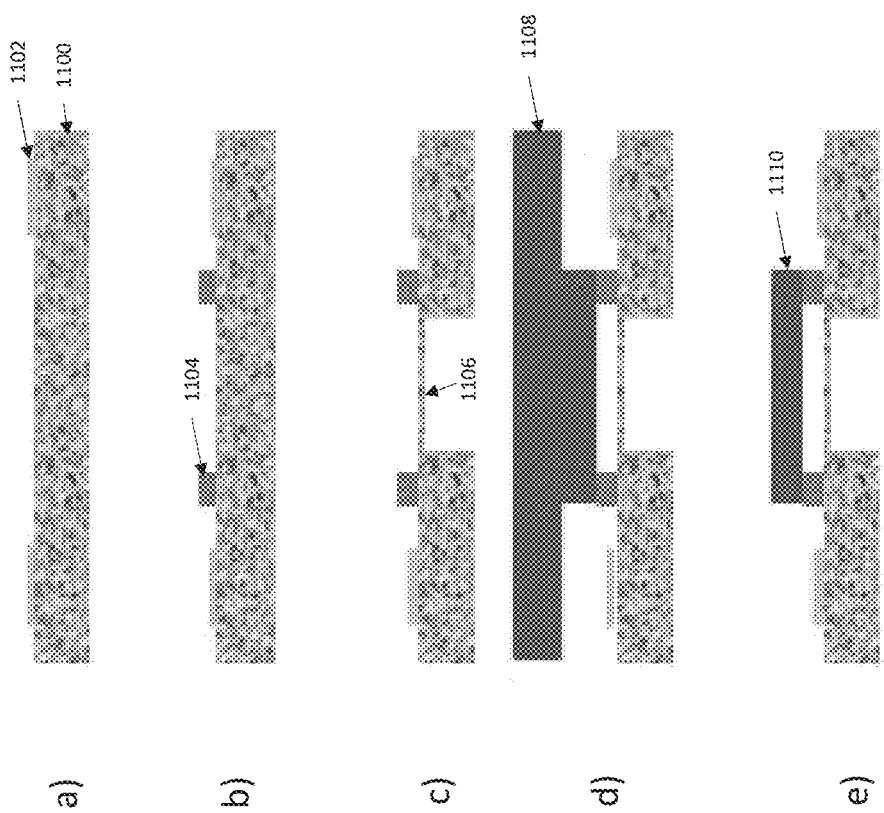
FIG. 11 includes FIGS. 11A through 11E and illustrates an embodiment of a wafer-level method of manufacturing the sensor package shown in FIG. 7.
Figure 11B:
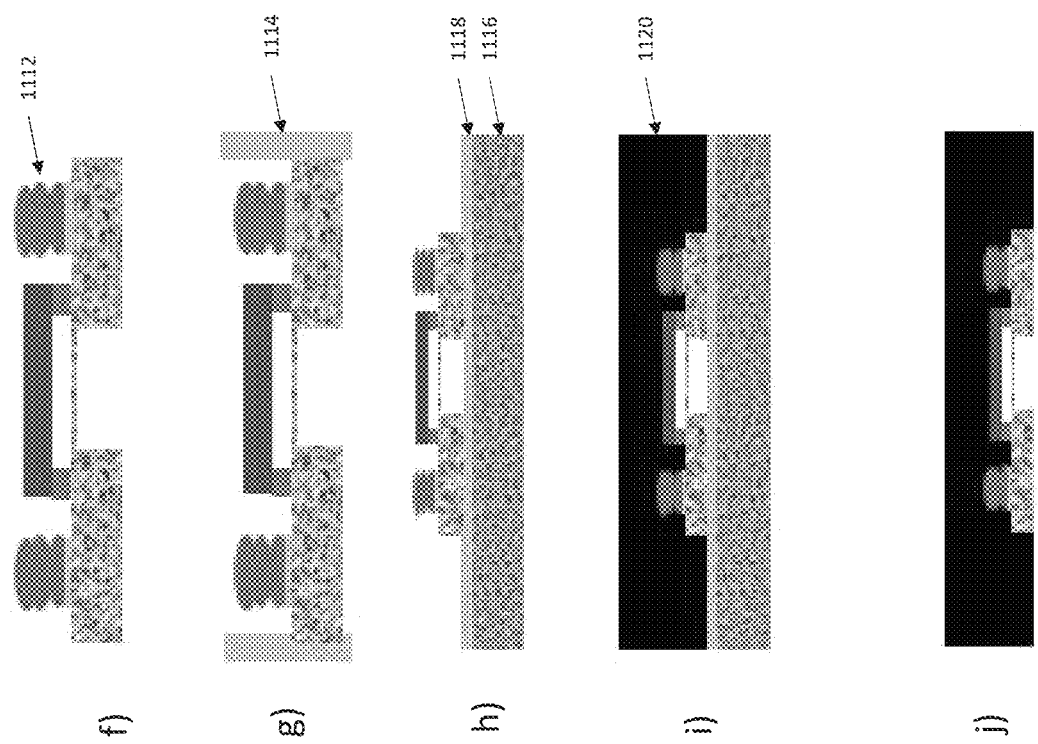
Figure 11C:
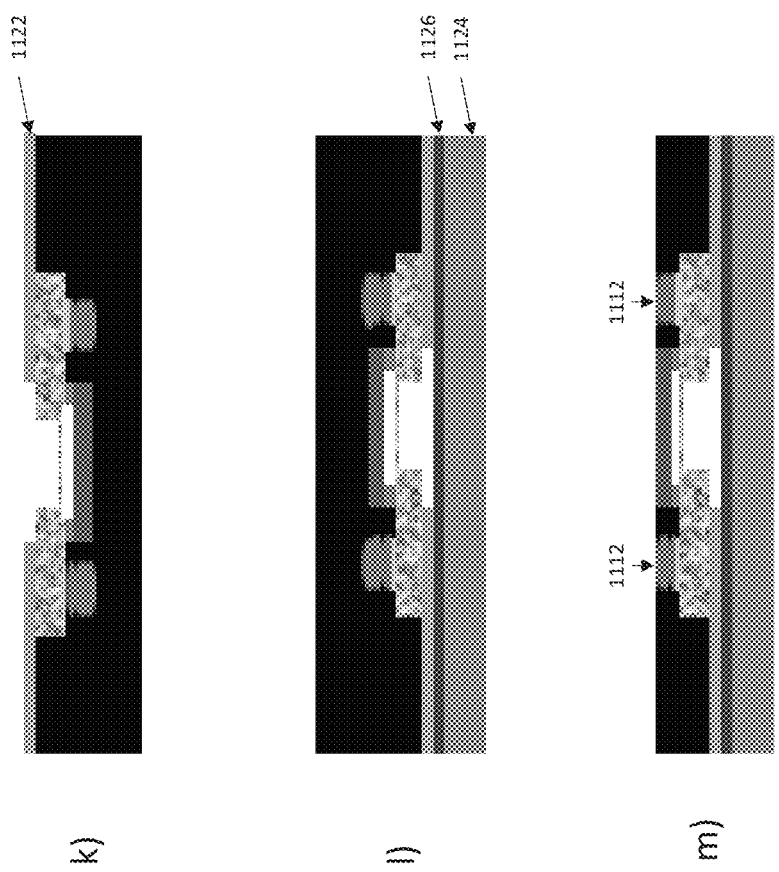
Figure 11D:
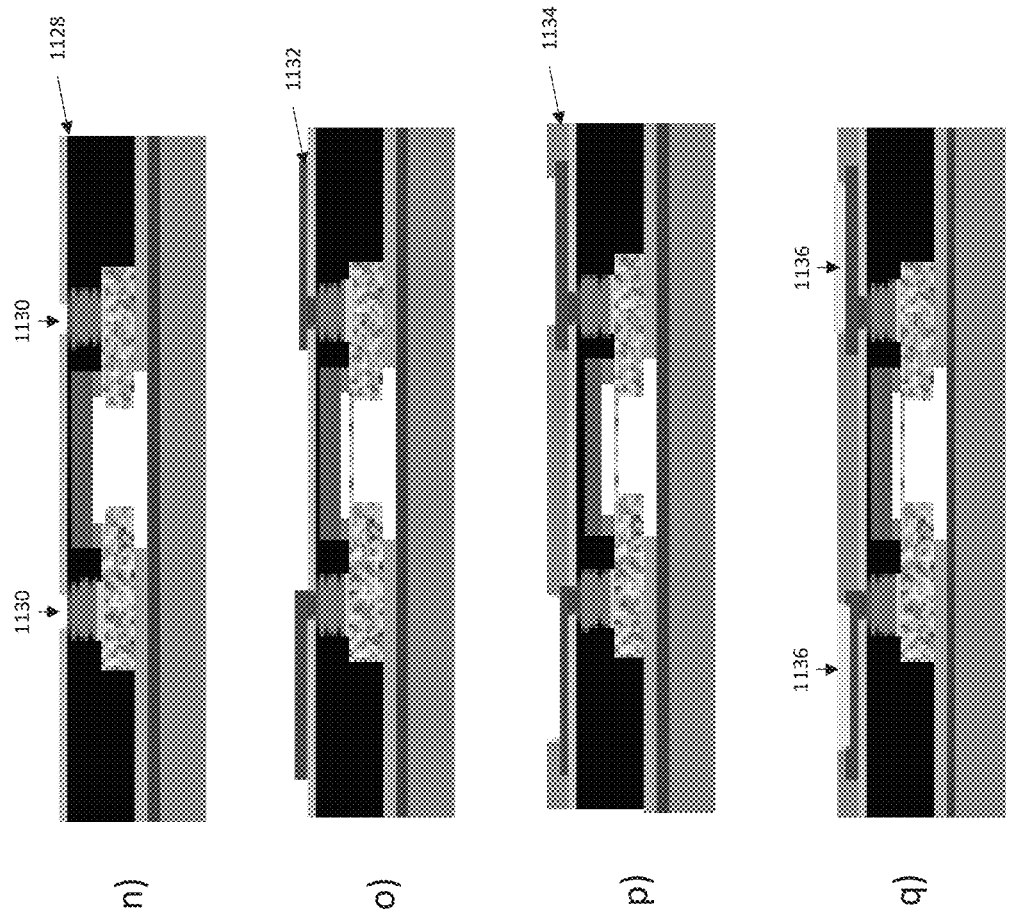
Figure 11E:
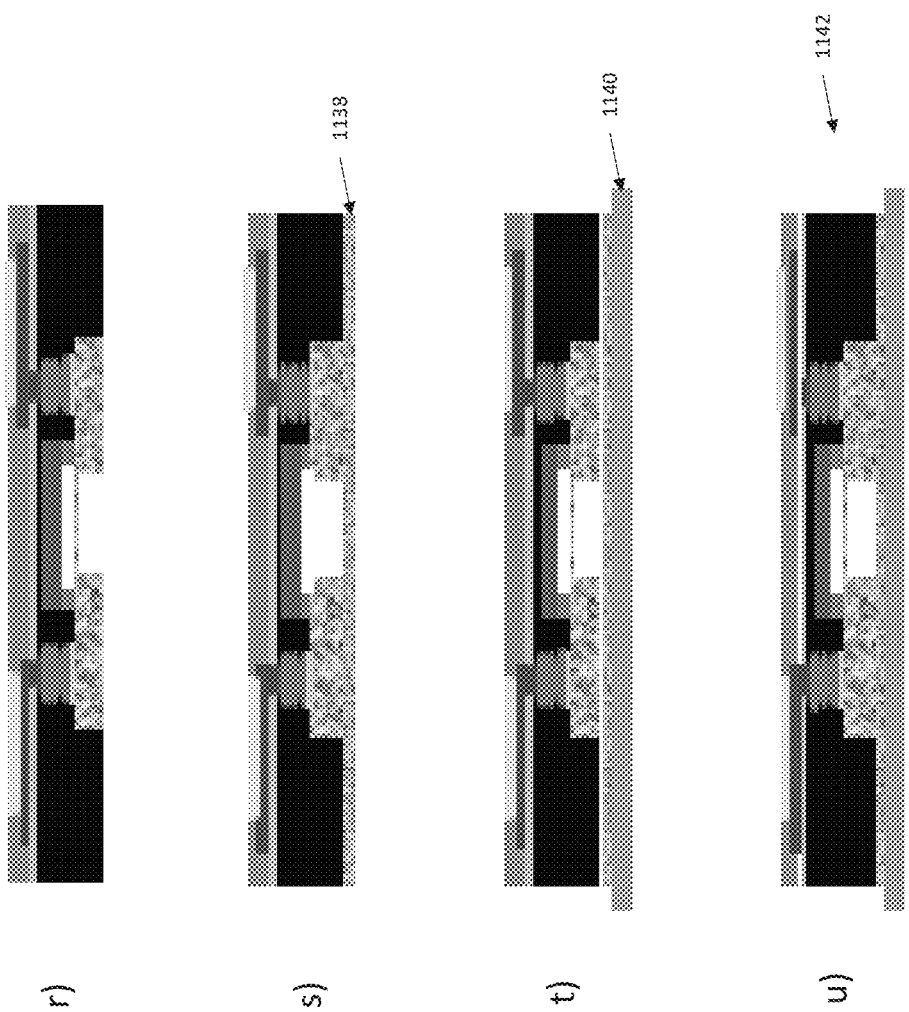

FIG. 11 includes FIGS. 11A through 11E and illustrates an embodiment of a method of manufacturing the sensor package 1000 shown in FIG. 10, wherein FIG. 11A illustrates steps a) to e), FIG. 11B illustrates steps f) to j), FIG. 11C illustrates steps k) to m), FIG. 11D illustrates steps n) to q), and FIG. 11E illustrates steps r) to u). In step a), a semiconductor wafer 1100 is provided with re-routing pads 1102. In step b), a stand-off frame 1104 is formed on the wafer 1100. In step c), a sensor structure 1106 such as a MEMS sensor structure is formed in the wafer 1100 using standard etching processes. The TSP is out of view in FIG. 11. In step d), a lid substrate 1108 such as a glass substrate is attached to the stand-off frame 1104. In step e), the lid substrate 1108 is ground down to form a lid 1110 for protecting the sensor structure 1106. In step f), interconnects 1112 are formed to the re-routing pads 1102 e.g. by standard stud-bumping, solder balls, pillars, etc. In step g), individual sensor dies are singulated using a dicing tool 1114. In step h), the individual sensor dies are attached to an eWLB carrier 1116 e.g. by an adhesive 1118. In step i), the individual sensor dies are over-molded with a mold compound 1120. In step j), the eWLB carrier is removed. In step k), an adhesive 1122 such as glue is applied to the back-side of each individual sensor die and the back-side of the mold compound 1120. In step l), the die/mold compound structure is bonded to a carrier 1124 such as a glass carrier via the adhesive 1122 and an optional additional adhesive 1126 on the carrier 1124.

In step m), the mold compound 1120 is thinned to expose the interconnects 1112. This way, different height tolerances for the lid 1110, interconnects 1112 and mold compound 1120 are irrelevant and do not affect the overall height tolerance of the sensor packages being produced. In one embodiment, the mold compound 1120 is thinned by grinding e.g. by CMP. By grinding/CMP the mold compound 1120, all height tolerances are brought to the same (single) planarized level. Only the tolerance of the grinding machine controls. The grinding process can be stopped by infrared line and measurement of a special die implemented in the eWLB wafer, where the thickness of this die is measured during the grinding process. In another embodiment, eWLB wafers are grouped by thickness and each group is ground in a different way. In step n), a dielectric 1128 is deposited in the thinned surface of the eWLB wafer as part of the RDL process. The dielectric 1128 has openings 1130 which expose the interconnects 1112. In step o), a metal redistribution layer 1132 is formed on the dielectric layer 1128. The metal redistribution layer 1132 contacts the interconnects 1112 through the openings 1130 in the dielectric 1128. In step p), a solder stop layer 1334 is formed on the metal redistribution layer 1132. The solder stop layer 1334 is for containing solder which is later formed on the metal redistribution layer 1132. In step q), solder pad finish 1136 is applied to the metal redistribution layer 1132 e.g. by solder paste printing, solder ball apply, electroless pad plating (e.g. NiPPdAu), galvanic plated solder cap, etc. In step r), the carrier 1124 is removed (de-bonded) from the eWLB substrate. In step s), a protection mesh 1138 is attached to the back-side of the eWLB substrate e.g. by lamination. In step t), the eWLB substrate with the protection mesh 1138 is mounted to a frame 1140. In step u), the eWLB substrate is subjected to a singulation process to yield individual molded pressure sensor packages 1142.

Figure 12:
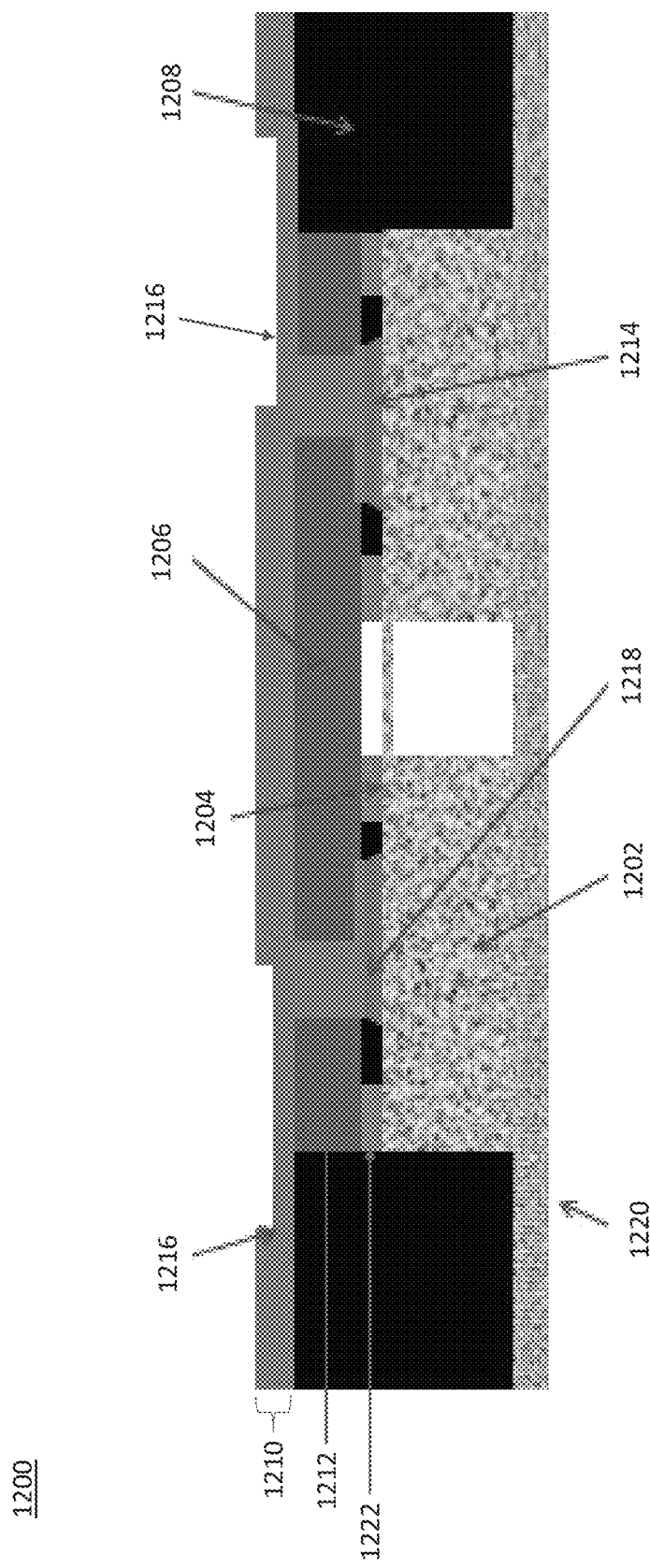
FIG. 12 illustrates a sectional view of an embodiment of a sensor package having a through semiconductor port.

FIG. 12 illustrates yet another embodiment of a sensor package 1200 having a semiconductor substrate/die 1202 such as a Si die with a sensing area 1204 such as a MEMS sensor structure. An interposer 1206 such as a Si substrate/die is bonded on the semiconductor substrate die 1202 and acts as a protection lid for the die sensing area 1204 so that no additional lid on the die 1202 is required. The semiconductor substrate/die 1202 bonded with the interposer 1206 is embedded in a mold compound 1208. An RDL 1210 on the eWLB back-side is connected to the interposer 1206. The interposer 1206 includes vertical interconnects 1212 such as through-silicon vias (TSVs) to connect bond pads 1214 of the semiconductor substrate/die 1202 to metal traces 1216 of the RDL 1210. Solder 1218 can be used to join the die pond pads 1214 to the vertical interconnects 1212 of the interposer 1206. The RDL 1210 routes to solder pads (not shown) placed in the fan-out area. Solder pad finish (not shown) can be done by solder paste printing, solder ball apply, electroless pad plating (e.g. NiPPdAu), galvanic plated solder cap, etc. A protection mesh 1220 can be provided at the opposite side of the package 1200 as the RDL 1210. An optional standoff frame 1222 can be provided as a spacer between the interposer 1206 and the semiconductor substrate/die 1202, to accommodate the electrical connections therebetween. The TSP is out-of-view in FIG. 12.

Figure 13B:
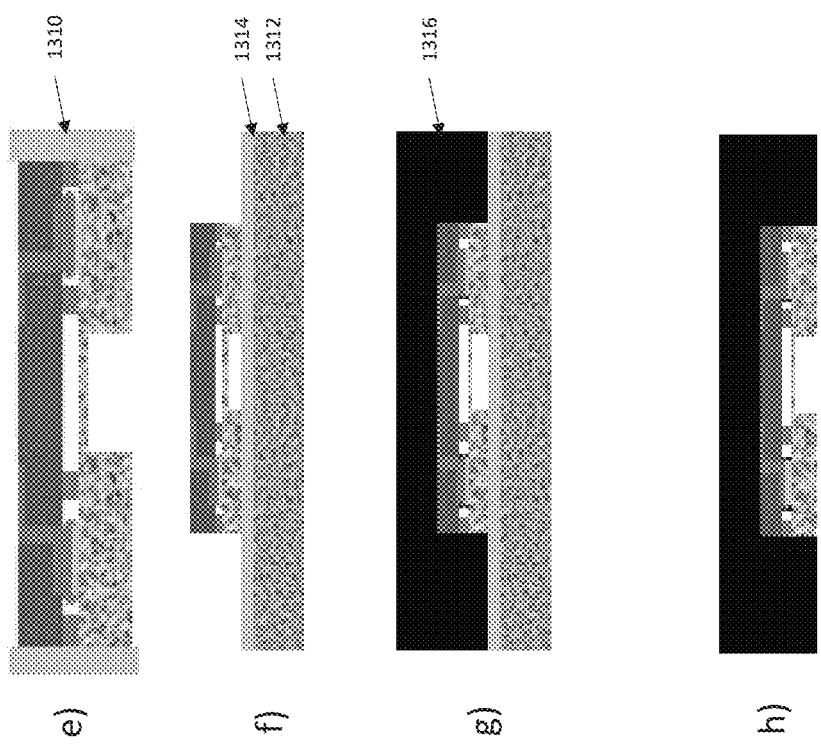
FIG. 13 includes FIGS. 13A through 13E and illustrates an embodiment of a wafer-level method of manufacturing the sensor package shown in FIG. 12.
Figure 13C:
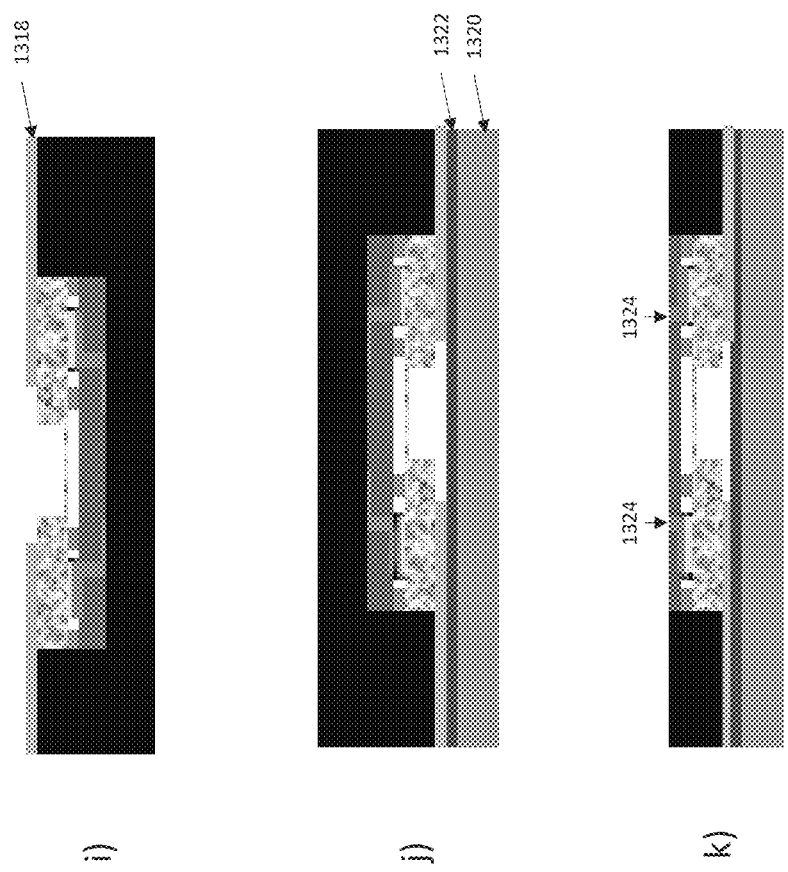
Figure 13D:
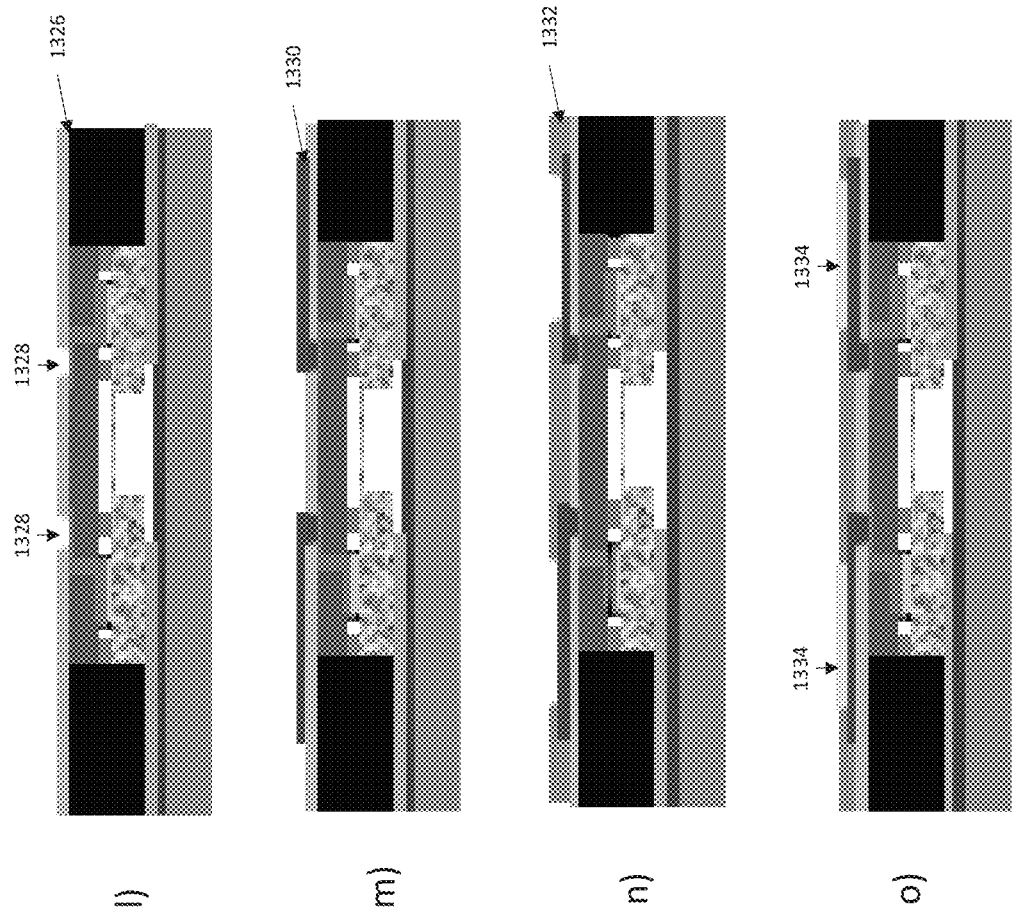
Figure 13E:
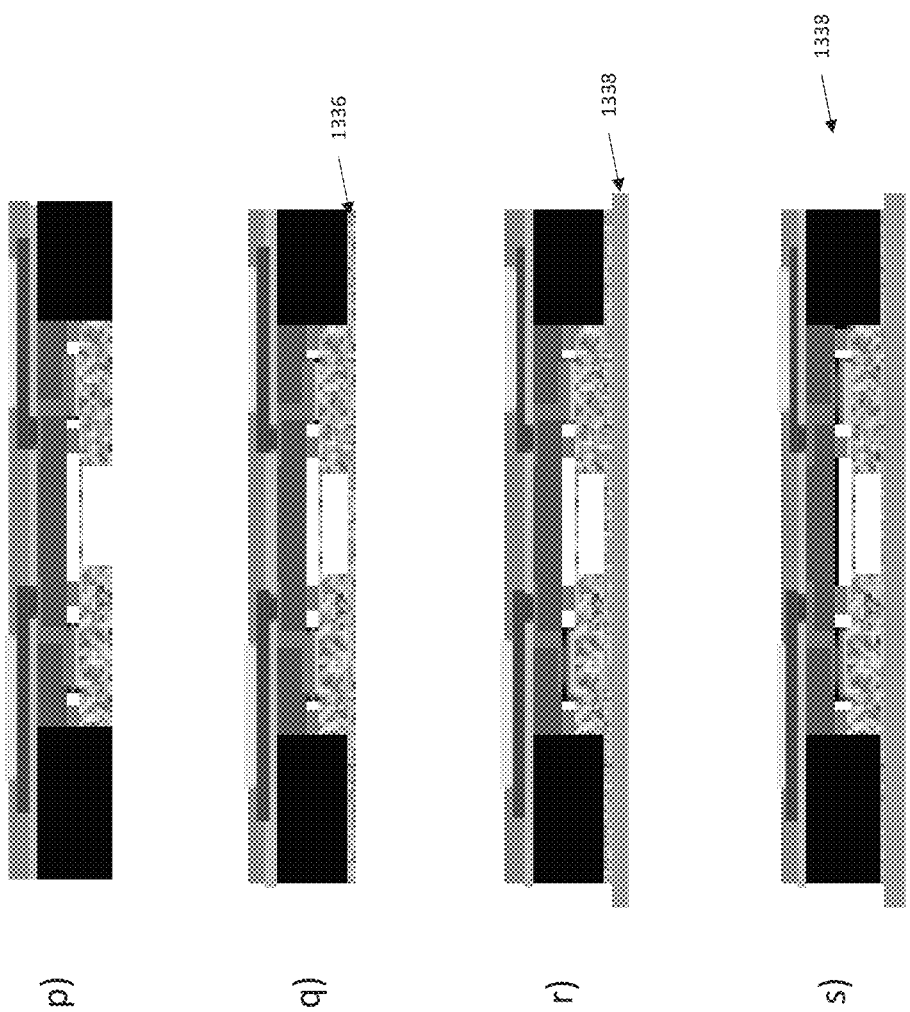

FIG. 13 includes FIGS. 13A through 13E and illustrates an embodiment of a method of manufacturing the sensor package 1200 shown in FIG. 12, wherein FIG. 13A illustrates steps a) to d), FIG. 13B illustrates steps e) to h), FIG. 130 illustrates steps i) to k), FIG. 13D illustrates steps l) to o), and FIG. 13E illustrates steps p) to s). In step a), a semiconductor wafer 1300 is provided with re-routing pads 1302. In step b), a stand-off frame 1304 is formed on the wafer 1300. In step c), a sensor structure 1306 such as a MEMS sensor structure is formed in the wafer 1100 using standard etching processes. The TSP is out of view in FIG. 13. In step d), an interposer 1308 e.g. of the kind previously described herein and illustrated in FIG. 12 is soldered to the re-routing pads 1302 of the semiconductor wafer 1300. In step e), individual sensor dies are singulated using a dicing tool 1310. In step f), the individual sensor dies are attached to an eWLB carrier 1312 e.g. by an adhesive 1314. In step g), the individual sensor dies are over-molded with a mold compound 1316. In step h), the eWLB carrier is removed. In step i), an adhesive 1318 such as glue is applied to the back-side of each individual sensor die and the back-side of the mold compound 1316. In step j), the die/mold compound structure is bonded to a carrier 1320 such as a glass carrier via the adhesive 1318 and an optional additional adhesive 1322 on the carrier 1312.

In step k), the mold compound 1316 is thinned to expose interconnects 1324 of the interposer 1308. This way, different height tolerances for the interposer 1308, interconnects 1324 and mold compound 1316 are irrelevant and do not affect the overall height tolerance of the sensor packages being produced. In one embodiment, the mold compound 1316 is thinned by grinding e.g. by CMP. By grinding CMP the mold compound 1316, all height tolerances are brought to the same (single) planarized level. Only the tolerance of the grinding machine controls. The grinding process can be stopped by infrared line and measurement of a special die implemented in the eWLB wafer, where the thickness of this die is measured during the grinding process. In another embodiment, eWLB wafers are grouped by thickness and each group is ground in a different way. In step l), a dielectric 1326 is deposited in the thinned surface of the eWLB wafer as part of the RDL process. The dielectric 1326 has openings 1328 which expose the interconnects 1324. In step m), a metal redistribution layer 1330 is formed on the dielectric layer 1326. The metal redistribution layer 1330 contacts the interconnects 1324 through the openings 1328 in the dielectric 1326. In step n), a solder stop layer 1332 is formed on the metal redistribution layer 1330. The solder stop layer 1332 is for containing solder which is later formed on the metal redistribution layer 1330. In step o), solder pad finish 1334 is applied to the metal redistribution layer 1330 e.g. by solder paste printing, solder ball apply, electroless pad plating (e.g. NiPPdAu), galvanic plated solder cap, etc. In step p), the carrier 1320 is removed (de-bonded) from the eWLB substrate. In step q), a protection mesh 1336 is attached to the back-side of the eWLB substrate e.g. by lamination. In step r), the eWLB substrate with the protection mesh 1336 is mounted to a frame 1338. In step s), the eWLB substrate is subjected to a singulation process to yield individual molded pressure sensor packages 1338.

Figure 14:
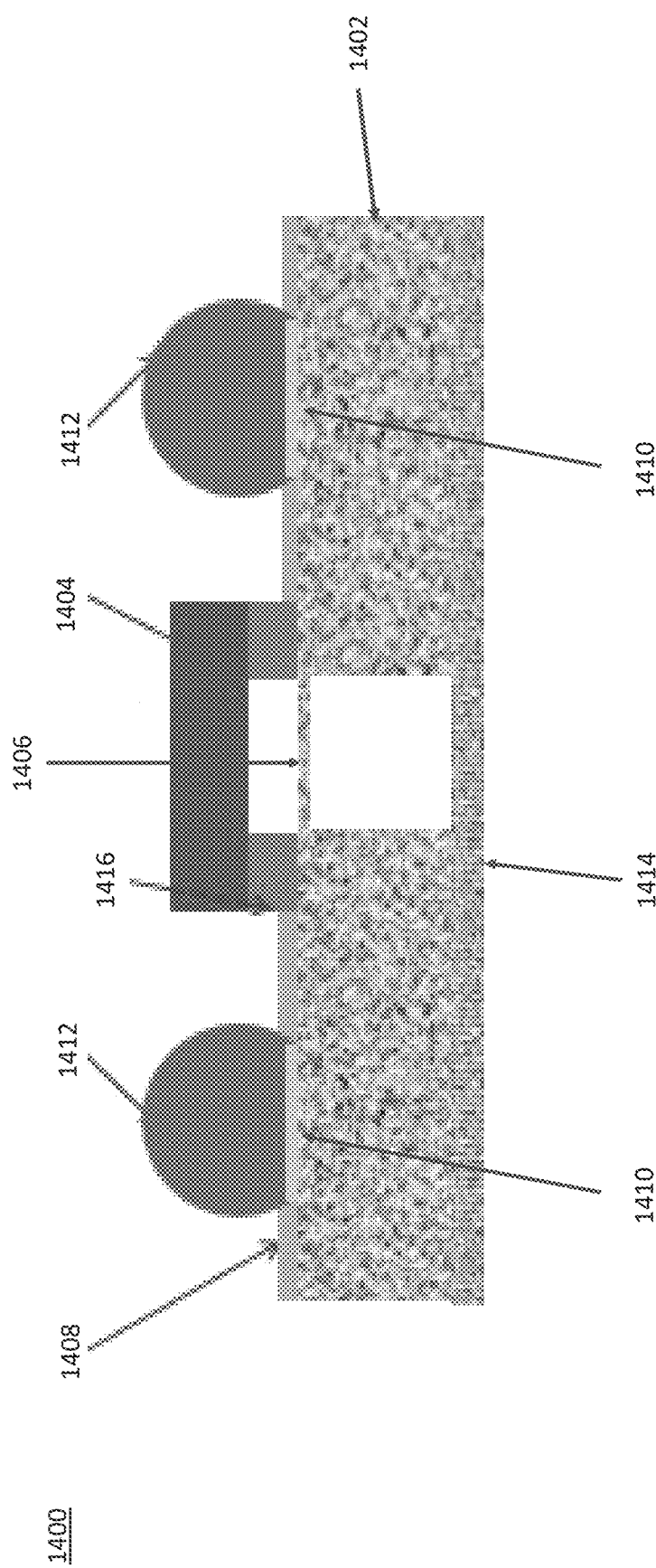
FIG. 14 illustrates a sectional view of an embodiment of a sensor package having a through semiconductor port.

FIG. 14 illustrates an embodiment of a sensor package 1400. The embodiment illustrated in FIG. 14 is similar to the embodiment illustrated in FIG. 10. Different, however, the sensor package 1400 shown in FIG. 14 has no eWLB fanout. The sensor package 1400 has a semiconductor substrate/die 1402 such as a Si die with a protection lid 1404 over a sensing area 1406 such as a MEMS sensor structure and an RDL 1408 having with interconnects 1410 to which connect solder balls 1412 are attached for providing external electrical connections to the substrate die 1002. A protection mesh 1414 can be provided at the opposite side of the package 1400 as the RDL layer 1408. An optional standoff frame 1416 can be provided e.g. as part of the RDL 1408 to seal the cavity between the lid 1404 and the substrate/die 1402. The TSP is out-of-view in FIG. 14.

Figure 15A:
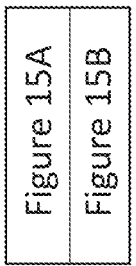
FIG. 15 includes FIGS. 15A through 15B and illustrates an embodiment of a wafer-level method of manufacturing the sensor package shown in FIG. 14.
Figure 15A:
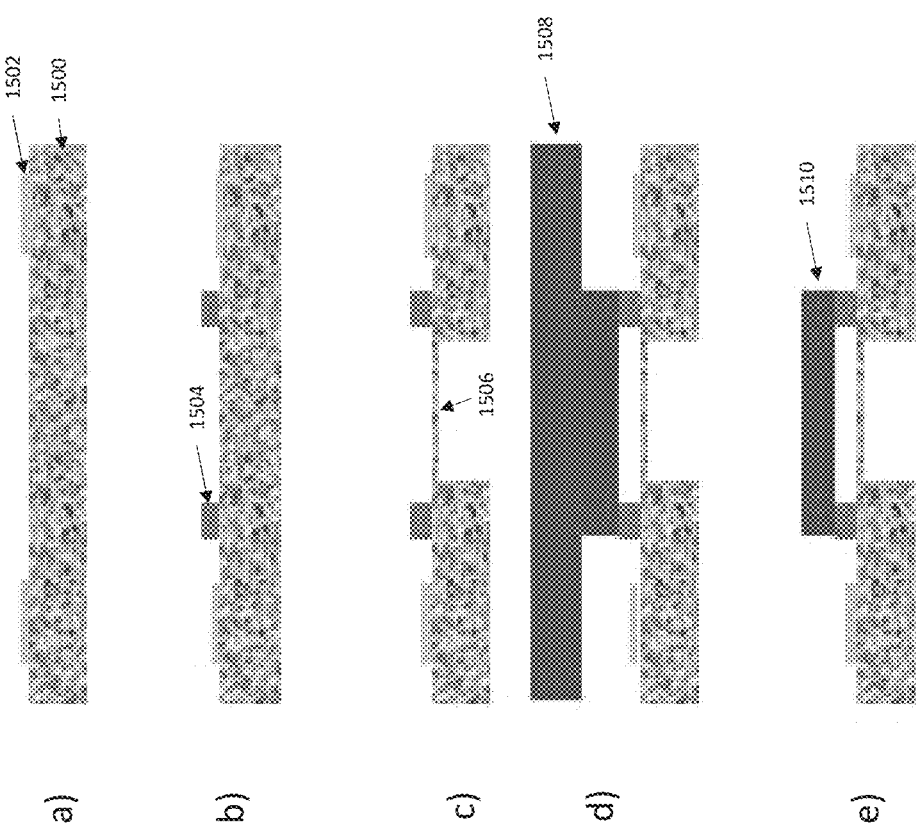
Figure 15B:
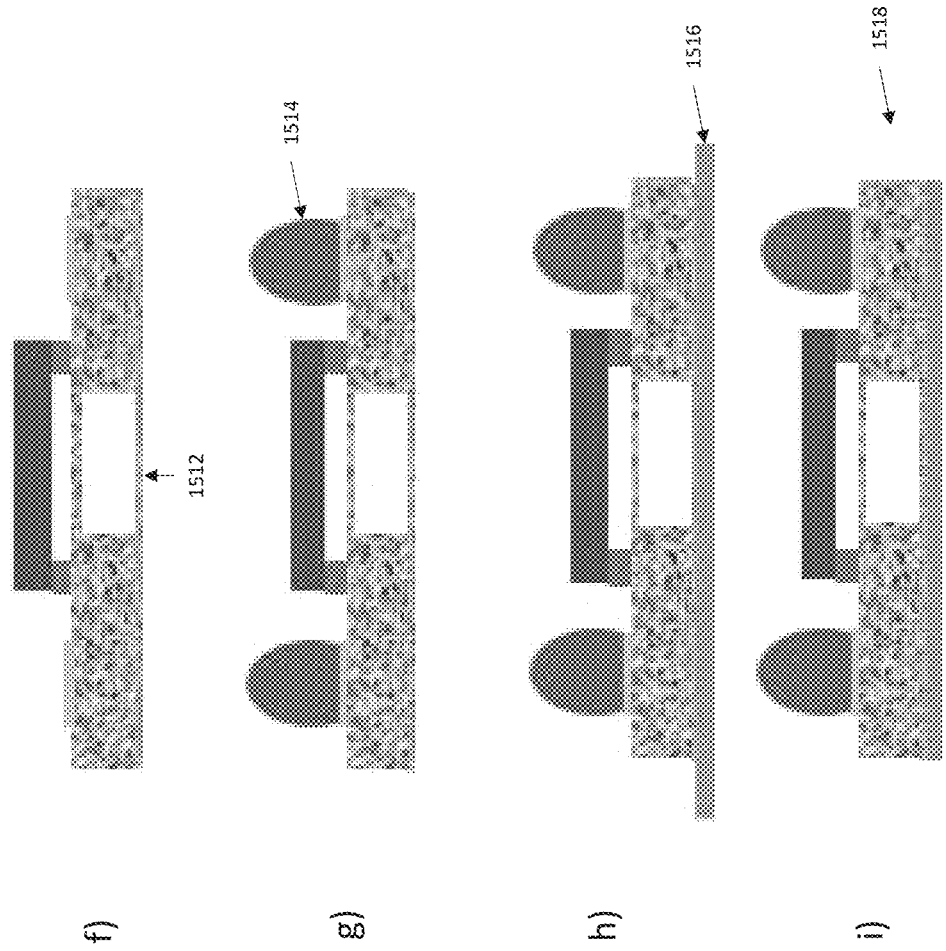

FIG. 15 includes FIGS. 15A through 15B and illustrates an embodiment of a method of manufacturing the sensor package 1400 shown in FIG. 14, wherein FIG. 15A illustrates steps a) to e), and FIG. 15B illustrates steps f) to i). In step a), a semiconductor wafer 1500 is provided with re-routing pads 1502. In step b), a stand-off frame 1504 is formed on the wafer 1500. In step c), a sensor structure 1506 such as a MEMS sensor structure is formed in the wafer 1500 using standard etching processes. The TSP is out of view in FIG. 15. In step d), a lid substrate 1508 such as a glass substrate is attached to the stand-off frame 1504. In step e), the lid substrate 1508 is ground down to form a lid 1510 for protecting the sensor structure 1506. In step f), a protection mesh 1512 is attached to the back-side of the eWLB substrate e.g. by lamination. In step g), solder balls 1514 are formed on the re-routing pads 1502 of the semiconductor wafer 1500. In step h), the eWLB substrate with the protection mesh 1512 is mounted to a frame 1516. In step i), the eWLB substrate is subjected to a singulation process to yield individual molded pressure sensor packages 1518.

Figure 16:
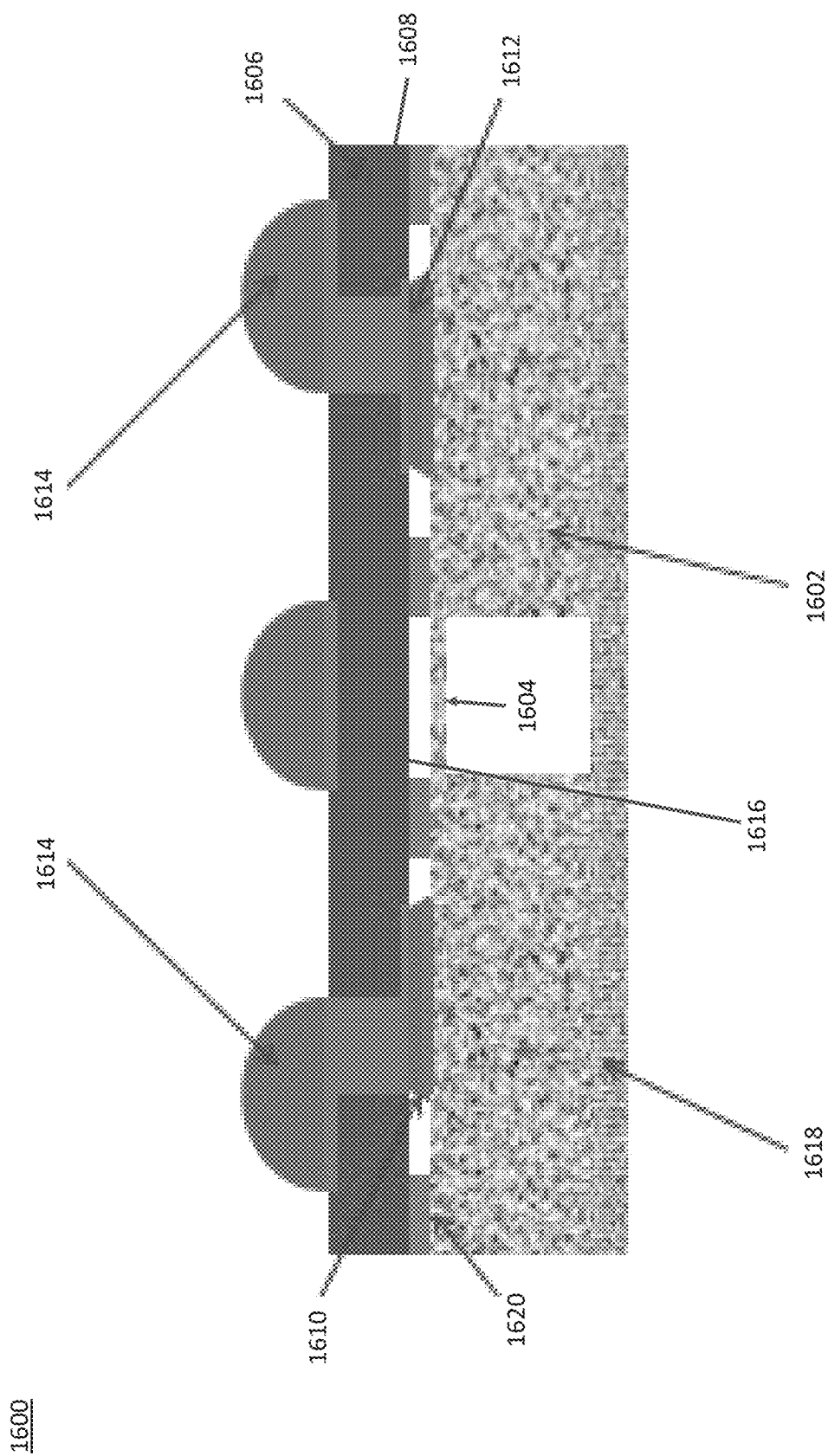
FIG. 16 illustrates a sectional view of an embodiment of a sensor package having a through semiconductor port.

FIG. 16 illustrates an embodiment of a sensor package 1600. The embodiment illustrated in FIG. 16 is similar to the embodiment illustrated in FIG. 12. Different, however, the sensor package 1600 shown in FIG. 16 has no eWLB fanout. The sensor package 1600 has a semiconductor substrate die 1602 such as a Si die with a sensing area 1604 such as a MEMS sensor structure. An interposer 1606 such as a Si substrate/die is bonded on the semiconductor substrate/die 1602 and acts as a protection lid for the die sensing area 1604 so that no additional lid on the die 1602 is required. The interposer 1606 includes vertical interconnects 1608 such as through-silicon vias (TSVs) connected to bond pads 1610 of the semiconductor substrate/die 1602 by solder or adhesive 1612. Solder bumps 1614 are formed on metal pads 1616 on the opposite side of the interposer 1606 to provide external electrical connections to the semiconductor substrate/die 1602. A protection mesh 1618 can be provided at the opposite side of the package 1600 as the RDL 1210. An optional standoff frame 1620 can be provided as a spacer between the interposer 1606 and the semiconductor substrate/die 1602, to accommodate the electrical connections therebetween. The TSP is out-of-view in FIG. 16.

Figure 17A:
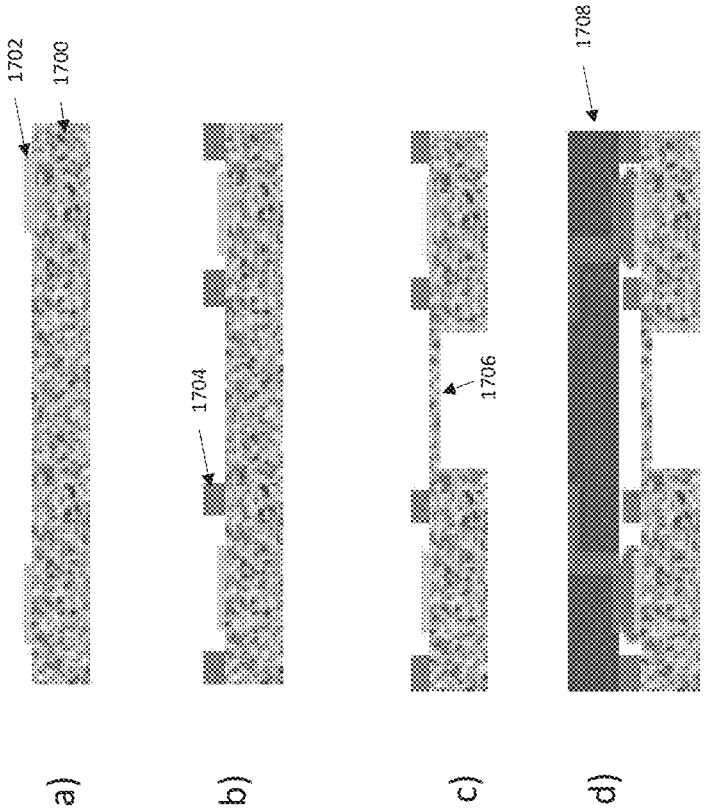
FIG. 17 includes FIGS. 17A through 17B and illustrates an embodiment of a wafer-level method of manufacturing the sensor package shown in FIG. 16.
Figure 17B:
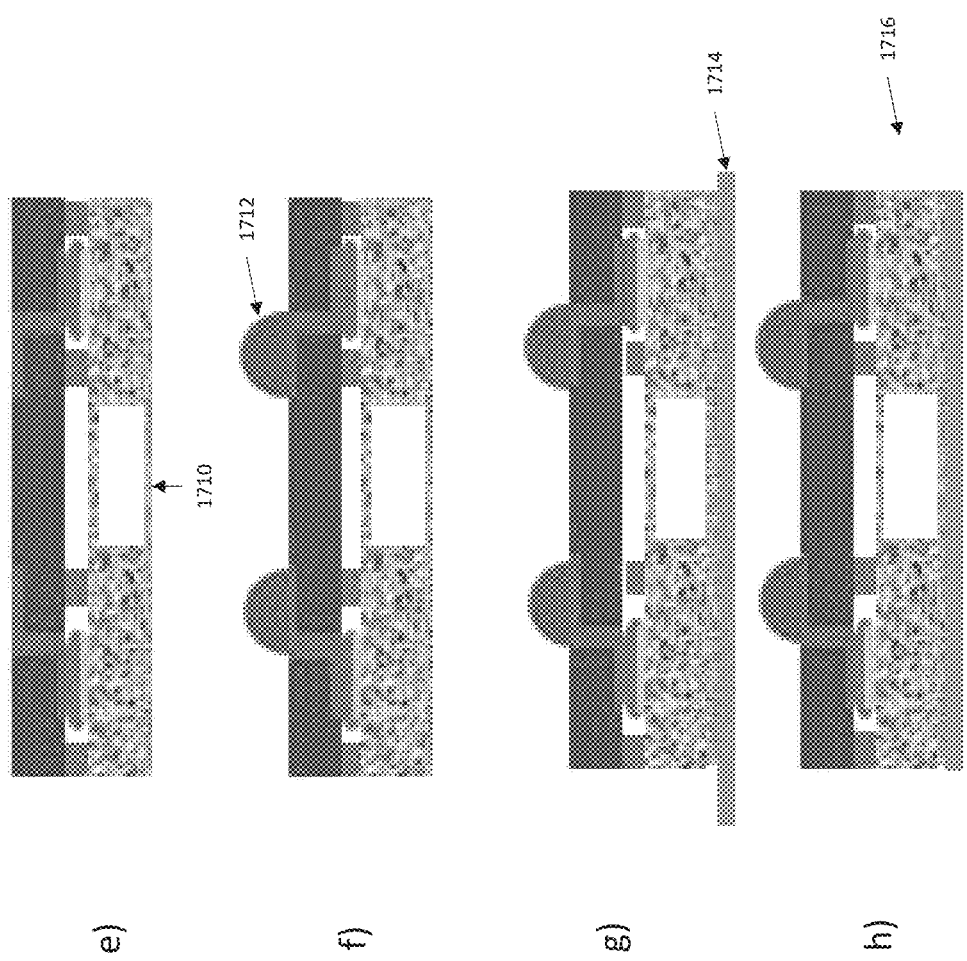

FIG. 17 includes FIGS. 17A through 17B and illustrates an embodiment of a method of manufacturing the sensor package 1600 shown in FIG. 16, wherein 17A illustrates steps a) to d), and FIG. 17B illustrates steps e) to h). In step a), a semiconductor wafer 1700 is provided with re-routing pads 1702. In step b), a stand-off frame 1704 is formed on the wafer 1700. In step c), a sensor structure 1706 such as a MEMS sensor structure is formed in the wafer 1700 using standard etching processes. The TSP is out of view in FIG. 17. In step d), an interposer 1708 e.g. of the kind previously described herein and illustrated in FIG. 12 is soldered to the re-routing pads 1702 of the semiconductor wafer 1700. In step e), a protection mesh 1710 is attached to the back-side of the eWLB substrate e.g. by lamination. In step f), solder bumps 1712 are formed on the re-routing pads 1702 of the semiconductor wafer 1700. In step g), the eWLB substrate with the protection mesh 1712 is mounted to a frame 1714. In step h), the eWLB substrate is subjected to a singulation process to yield individual molded pressure sensor packages 1716.

The embodiments described herein provide particle and contamination protection at wafer level, while enabling the use of standard mold technologies for MEMS devices. As such, a MEMS package with lower overall cost and decreased package size can be realized.

Terms such as "first", "second", and the like, are used to describe various elements, regions, sections, etc. and are not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor package, comprising:
    a semiconductor die having a sensor structure disposed at a first side of the semiconductor die; and
    a first port extending through the semiconductor die from the first side to a second side of the semiconductor die opposite the first side, the first port providing a link between the sensor structure and the outside environment,
    wherein the first port comprises a larger diameter hole extending from the second side towards the first side and terminating prior to reaching the sensor structure, and a plurality of smaller diameter holes extending from the first side towards the second side and disposed around the sensor structure,
    wherein the smaller diameter holes are in open communication with the larger diameter hole in a region of the semiconductor die outside the sensor structure.

2. The semiconductor package of claim 1, further comprising a cap/lid attached to the first side of the semiconductor die and covering the sensor structure and the smaller diameter holes.

3. The semiconductor package of claim 1, further comprising a substrate to which the semiconductor die is attached at the second side, wherein the substrate has an opening at least partly aligned with the first port.

4. The semiconductor package of claim 1, further comprising:
    a cap/lid attached to the first side of the semiconductor die and covering the sensor structure; and
    a mold compound encapsulating the cap/lid and the first side of the semiconductor die.

5. The semiconductor package of claim 4, further comprising:
    a substrate attached to the mold compound; and
    electrical conductors extending from the first side of the semiconductor die to the substrate through the mold compound.

6. The semiconductor package of claim 4, further comprising a leadframe attached to the second side of the semiconductor die, wherein the leadframe has an opening at least partly aligned with the first port.

7. The semiconductor package of claim 4, further comprising:
    a substrate attached to the second side of the semiconductor die;
    a second port extending through the semiconductor die from the first side to the second side outside the sensor structure; and
    an opening in the mold compound which extends to the first side of the semiconductor die and is at least partly aligned with the second port,
    wherein the second port is in open communication with the first port.

8. The semiconductor package of claim 4, further comprising through-mold interconnects which extend through the mold compound and connect bond pads of the semiconductor die to a redistribution layer on the mold compound.

9. The semiconductor package of claim 8, wherein the mold compound and the through-mold interconnects terminate at the same planarized level at a side of the mold compound facing away from the semiconductor die.

10. The semiconductor package of claim 1, wherein the sensor structure is a MEMS sensor structure.

11. The semiconductor package of claim 1, further comprising:
    an interposer attached to the first side of the semiconductor die and covering the sensor structure; and
    a mold compound encapsulating the interposer and the first side of the semiconductor die.

12. The semiconductor package of claim 11, further comprising a redistribution layer on the mold compound and the interposer, wherein the interposer provides electrical connections between the semiconductor die and the redistribution layer.

13. The semiconductor package of claim 12, wherein the mold compound and the interposer terminate at the same planarized level at a side of the mold compound facing away from the semiconductor die.

14. A semiconductor package, comprising:
    a semiconductor die having a sensor structure disposed at a first side of the semiconductor die; and
    a plurality of separate trenches extending through the semiconductor die from the first side to a second side of the semiconductor die opposite the first side, the plurality of separate trenches forming spring structures around the sensor structure which decouple the sensor structure from mechanical stresses, wherein the plurality of separate trenches provides a link between the sensor structure and the outside environment.

15. The semiconductor package of claim 14, wherein the sensor structure is a MEMS sensor structure.

* * * * *